(12) United States Patent
Jacob et al.

(10) Patent No.: US 11,971,226 B2
(45) Date of Patent: Apr. 30, 2024

(54) HIGH TEMPERATURE THERMAL DUAL-BARRIER COATING

(71) Applicant: Purdue Research Foundation, West Lafayette, IN (US)

(72) Inventors: Zubin Jacob, West Lafayette, IN (US); Xueji Wang, West Lafayette, IN (US); Ali Jishi, West Lafayette, IN (US); Avra Sankar Bandyopadhyay, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 314 days.

(21) Appl. No.: 17/573,558

(22) Filed: Jan. 11, 2022

(65) Prior Publication Data

US 2022/0221234 A1 Jul. 14, 2022

Related U.S. Application Data

(60) Provisional application No. 63/136,608, filed on Jan. 12, 2021.

(51) Int. Cl.
*F28F 13/18* (2006.01)
*C23C 14/08* (2006.01)
*C23C 14/14* (2006.01)
*C23C 14/30* (2006.01)
*C23C 14/34* (2006.01)

(52) U.S. Cl.
CPC ......... *F28F 13/185* (2013.01); *C23C 14/083* (2013.01); *C23C 14/14* (2013.01); *C23C 14/30* (2013.01); *C23C 14/3464* (2013.01); *Y10T 428/24917* (2015.01)

(58) Field of Classification Search
None
See application file for complete search history.

(56) References Cited

U.S. PATENT DOCUMENTS

| | | | |
|---|---|---|---|
| 7,429,424 B2 | 9/2008 | Boutwell et al. | |
| 8,470,460 B2 | 6/2013 | Lee | |
| 2006/0078432 A1* | 4/2006 | Darolia | F01D 5/288 416/241 R |
| 2010/0092747 A1* | 4/2010 | Chung | C23C 14/022 428/220 |
| 2015/0140356 A1* | 5/2015 | Riggs | C23C 4/11 428/312.6 |

(Continued)

FOREIGN PATENT DOCUMENTS

EP 2283169 B1 5/2014

OTHER PUBLICATIONS

International Search Report for PCT/US2022/012039, dated Oct. 5, 2022, pp. 1-3 (Year: 2022).*

(Continued)

*Primary Examiner* — Seth Dumbris
(74) *Attorney, Agent, or Firm* — Piroozi-IP, LLC

(57) ABSTRACT

A thermal dual-barrier coating system is disclosed which includes a first thermal barrier layer having a first thermal conductivity, one or more composite structures vertically disposed adjacent the first thermal barrier layer, each of the one or more composite structures includes an ultra-thin disordered semi-continuous metallic film and a layer of a second thermal barrier layer.

26 Claims, 29 Drawing Sheets

(56) References Cited

U.S. PATENT DOCUMENTS

2015/0321162 A1* 11/2015 Brodoceanu ............ C23C 16/06
  506/22
2016/0281513 A1* 9/2016 Kirby ................... C04B 41/009

OTHER PUBLICATIONS

Singheiser et al., Failure aspects of thermal barrier coatings. Materials at High Temperatures, 18(4), 249-259 (2001).

Song et al., High-temperature thermal properties of yttria fully stabilized zirconia ceramics. Journal of Rare Earths, 29(2), 155-159 (2011).

Zhao et al., Molten silicate interactions with thermal barrier coatings. Surface and Coatings Technology, 251, 74-86 (2014).

Götsch et al., From zirconia to yttria: Sampling the YSZ phase diagram using sputter-deposited thin films. AIP Advances, 6(2) (2016).

Spuckler et al., Infrared radiative properties of yttria-stabilized zirconia thermal barrier coatings. 26th Annual Conference on Advanced Ceramics and Composites (2013).

Padture et al., Thermal Barrier Coatings for Gas-Turbine Engine Applications Downloaded from (vol. 296) (2002).

Buchanan et al., Optical and Electrical Properties of Yttria Stabilized Zirconia (YSZ) Crystals. Technical Report No. 5. Contract No. US NAVY-N-00014-80-K-0969 (1981).

Padture, Advanced structural ceramics in aerospace propulsion. In Nature Materials (vol. 15, Issue 8, pp. 804-809). Nature Publishing Group (2016).

Adams et al., Young's Modulus, Flexural Strength, and Fracture of Yttria-Stabilized Zirconia versus Temperature. In J. Am. Ceram. Soc (vol. 80) (1997).

Smialek et al., Revisiting the birth of 7YSZ thermal barrier coatings: Stephan stecura. In Coatings (vol. 8, Issue 7). MDPI AG (2018).

Eldridge et al., Determination of scattering and absorption coefficients for plasma-sprayed yttria-stabilized zirconia thermal barrier coatings. Journal of the American Ceramic Society, 91(5), 1603-1611 (2008).

Dombrovsky et al., High temperature infrared properties of YSZ electrolyte ceramics for SOFCs: Experimental determination and theoretical modeling. Journal of the American Ceramic Society, 94(12), 4310-4316 (2011).

Del Campo et al., Effect of porosity on the infrared radiative properties of plasma-sprayed yttria-stabilized zirconia ceramic thermal barrier coatings. Journal of Physical Chemistry C, 118(25), 13590-13597 (2014).

Shimonosono et al., Mechanical and thermal properties of porous yttria-stabilized zirconia. Journal of Asian Ceramic Societies, 7(1), 20-30 (2019).

Wang et al., Thermal radiation properties of plasma-sprayed Gd2Zr2O7 thermal barrier coatings. Scripta Materialia 69.9, 674-677 (2013).

Siegel et al., Analysis of thermal radiation effects on temperatures in turbine engine thermal barrier coatings. In Materials Science and Engineering (vol. 245) (1998).

Kelly et al., Thermal Barrier Coatings Design with Increased Reflectivity and Lower Thermal Conductivity for High-Temperature Turbine Applications. Int. J. Appl. Ceram. Technol., 3 [2] 81-93 (2006).

Clarke et al., Thermal-barrier coatings for more efficient gas-turbine engines. MRS Bulletin, 37(10), 891-898 (2012).

Schulz et al., Review on Advanced EB-PVD Ceramic Topcoats for TBC Applications. International Journal of Applied Ceramic Technology, 1(4), 302-315 (2005).

Dyachenko et al., Controlling thermal emission with refractory epsilon-near-zero metamaterials via topological transitions. Nature Communications, 7(1), 11809 (2016).

Chirumamilla et al., Metamaterial emitter for thermophotovoltaics stable up to 1400 ° C. Scientific Reports, 9(1), 7241 (2019).

* cited by examiner

HIGH TEMPERATURE THERMAL DUAL-BARRIER COATING

CROSS-REFERENCE TO RELATED APPLICATIONS

The present patent application is related to and claims the priority benefit of U.S. Provisional Patent Application Ser. No. 63/136,608 filed Jan. 12, 2021, the contents of which are hereby incorporated by reference in its entirety into the present disclosure.

STATEMENT REGARDING GOVERNMENT FUNDING

This invention was made with government support under HR0011-21-9-0007 awarded by the Defense Advanced Research Projects Agency. The government has certain rights in the invention.

TECHNICAL FIELD

The present disclosure generally relates to thermal barriers, and in particular, to a thermal barrier effective for both conduction and radiation modes of thermal conductance.

BACKGROUND

This section introduces aspects that may help facilitate a better understanding of the disclosure. Accordingly, these statements are to be read in this light and are not to be understood as admissions about what is or is not prior art.

Thermal barrier coating (TBC) are used in a variety of different industries. TBCs are used to protect structures from exposure to extremely hot gases. For example, in gas turbines, protections of metallic structures from such harsh environments is key to longevity of these structures. In some cases, such TBCs provide drops in temperatures of about 100° C. or more within a 100 micron coating thickness.

When exposed to such high heat, typically two modes of heat transfer are operative: conduction and radiation. Current TBCs employ Yttrium-Stabilized-Zirconia (YSZ) with low thermal conductivity address only one such mode, i.e., YSZ provides a "single barrier" to energy flow by only blocking the heat flux due to conduction. At high operating temperatures, blackbody radiation from the hot gases to the underneath structures made up of, e.g., nickel super-alloy, constitutes a sizeable fraction (about 25% or more) of the total heat transport. This mode of heat transfer, i.e., radiation, is currently unmitigated.

There is, thus, a clear and urgent need for thermal dual-barrier coatings that not only reduce the thermal conduction flux to values comparable or better than current existing TBCs but also simultaneously block the thermal radiation transport, partially or completely.

However, achieving such a dual-barrier coating is a formidable challenge for at least two major reasons: (1) Blocking/reflecting thermal radiation is routinely accomplished using metals but metals immediately increase thermal conduction due to large electronic heat transport; and (2) The spectral region in which thermal radiation occurs is ultrabroadband from the visible to the long-wave-infrared region.

Therefore, there is an unmet need for a novel material arrangement that not only addresses heat transfer through conduction but also via radiation as the two dominant modes of heat transfer in a large number of industrial applications.

SUMMARY

A thermal dual-barrier coating (TDBC) system providing resistance for both conduction and radiation thermal transfer modes is disclosed. The TDBC system includes a first thermal barrier layer having a first thermal conductivity, one or more composite structures vertically disposed adjacent the first thermal barrier layer. Each of the one or more composite structures includes an ultra-thin disordered semi-continuous metallic film and a layer of a second thermal barrier layer.

A method of generating a thermal dual-barrier coating (TDBC) system is also disclosed. The method includes depositing a first thermal barrier layer having a first thermal conductivity, co-depositing one or more composite thermal metamaterial structures vertically adjacent the first thermal barrier layer. The deposition of each of the one or more composite structures, includes co-sputtering an ultra-thin disordered semi-continuous metallic film and a thin layer of a second thermal barrier layer.

BRIEF DESCRIPTION OF DRAWINGS

FIG. 8b is a graph of transmission properties which is a graph of transmission vs. wavelength for before and after RTA of FIG. 8a.

(FIG. 14a); and in $N_2$ purged ambient at T=900° C. for 1 hr (FIG. 14b).

(FIG. 20b).

DETAILED DESCRIPTION

Figure 1:
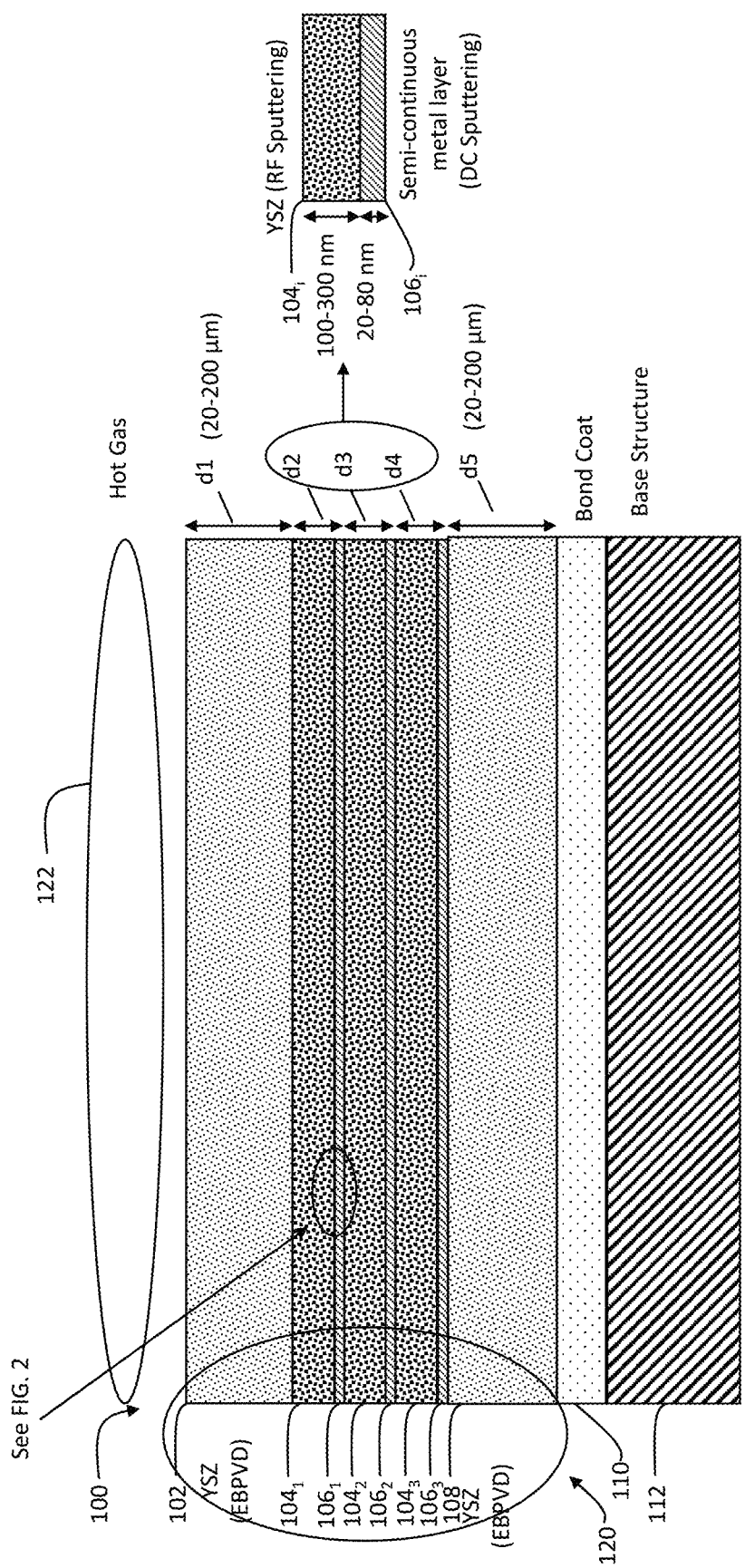
FIG. 1 is a schematic of a thermal dual-barrier coating (TDBC) system, having one or more composite structures, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

The present disclosure provides a novel material arrangement that not only addresses heat transfer through conduction but also via radiation as the two dominant modes of heat transfer in a large number of industrial applications. Towards this end, a high temperature hybrid metamaterial coating arrangement is disclosed which simultaneously suppresses both the thermal conduction and thermal radiation properties of a bulk engineered medium. Novel thermal dual barrier coatings (TDBCs) have been developed and disclosed herein that are based on Yttrium-Stabilized-Zirconia/Titanium (YSZ/Ti) which show low transmission properties (<10%) without sacrificing high-T thermal stability up to a temperature T of about 1500° C. Ti was utilized as a refractory metal and YSZ as the ceramic for the hybrid metamaterials, the latter being the most commonly used TBC because of its low thermal conductivity of about 2 W/mK. The YSZ/Ti metamaterials system, disclosed herein can be widely adopted in industry for optimization of existing thermal single barrier coatings and can pave the way for next generation coatings with significant global economic impact.

To achieve these TDBC, five key metrics are optimized: (1) Minimize thermal conductivity: At high temperatures, the heat transport is dominated by harmonic and anharmonic phonon transport (at small scales, heat is transferred vis vibration of crystalline structure, e.g., lattices, known to a person having ordinary skill as phonon) in insulating dielectrics. (2) Minimize transmittivity: High temperature blackbody thermal radiation from the hot gas is ultrabroadband causing a significant contribution to net heat flux reaching the protected structures, e.g., nickel super-alloy (Inconel). (3) Minimize self-emissivity: A secondary source of performance degradation arises from self-emissivity of the barrier coating itself in the form of thermal radiation originating inside the barrier and emitted to the cold side. This fundamental effect is surprisingly overlooked in conventional designs but can amount to about 5% or more of the total heat flux in conventional Yttrium-Stabilized-Zirconia (YSZ) based TBC especially for thicker coatings. (4) Provide high temperature stability, high melting point and long-term durability (mechanical, structural and compositional) as well protection from oxidation and corrosion through deep encapsulation. (5) Provide a clear path to transition towards an industry grade scalable approach for large area coatings. Thus the inventors of the present disclosure have drawn upon hybrid thermal metamaterials that can engineer phononic and photonic heat transport which can pave the way for next generation coatings. Towards this end, a metamaterial with intrinsic broadband radiation screening properties is disclosed. It should be noted that conventional meta-surfaces, photonic crystals, gratings and meta-material technologies that engineer thermal radiation use photolithography and/or e-beam lithography. Thus, these surface nanostructures disadvantageously create hot-spots that can lead to fracture, melting and degradation in oxidative and corrosive environments. In addition, these designs cannot be scaled to large area manufacturing required for large area applications. Thus a new arrangement is disclosed where the large-area hybrid thermal metamaterial is encapsulated within a highly robust host matrix that results in a fundamental advance for high temperature extreme environment barrier coatings.

According to one embodiment, in the new arrangement, disordered porous YSZ as the host matrix of the thermal metamaterial is employed to reach the universal lower bound of effective thermal conductivity. Furthermore, ultra-subwavelength semi-continuous thin films of metals or metal alloys with high plasma frequency are embedded within the YSZ host matrix to form hybrid thermal metamaterials. Additionally, thermal radiation screening is introduced to minimize the detrimental transmission of heat radiation between 0.5 μm<λ<20 μm in porous YSZ. Also, an intertwined layer-by-layer sputtering and co-sputtering process without photolithography or e-beam lithography is exploited for fabricating the hybrid thermal metamaterials.

Referring to FIG. 1, a TDBC system 100 is shown according to the present disclosure. The TDBC system 100 includes a topcoat 102 that can be deposited via an electron beam physical vapor deposition (EBPVD) of about 20 μm-200 μm of a nanoporous YSZ that is configured to be exposed to hot gases. The topcoat 102 allows the TDBC system 100 to retain its anti-corrosive, low thermal conductivity and high temperature properties of a traditional single barrier coating. Adjacent to the topcoat 102 is a strategically optimized meta-barrier layer which includes a one or more composite structures made of an RF sputtered YSZ $104_i$ and a DC sputtered semi-continuous metal layer $106_i$. According to one embodiment, there are three such composite structures (i.e., $1^{st}$ YSZ layer $104_1$ and $1^{st}$ metal layer $106_1$; $2^{nd}$ YSZ layer $104_2$ and $2^{nd}$ metal layer $106_2$; and $3^{rd}$ YSZ layer $104_3$ and $3^{rd}$ metal layer $106_3$). The DC sputtered metal $106_i$ represents an ultra-thin disordered semi-continuous metallic-alloy film which is selected from the group consisting of Ag, Al, W, Ti and a combinations thereof, and has a thickness in the range of 20-80 nm. The RF sputtered YSZ has a thickness in the range of 100-300 nm.

The topcoat 102, the one or more composite structures generally identified as 104$_i$ and 106$_i$ (three such structures are shown, however, no limitation as to the number of these composite structures is intended hereby, and the number can be one, two, three, four, or five such composite structures), and a bottom layer 108 is generally referred to herein as a thermal barrier structure 120 which is generally deposited on top of a bond coat 110 that is attached to a structure 112 to be protected from heat, typically in the form of hot gases 122. The bottom layer 108 is similarly deposited as the topcoat 102 using an EBPVD process depositing YSZ. The thickness of the bottom layer 108 is similar to the topcoat 102 which is in the range of 20-200 μm.

Figure 2:
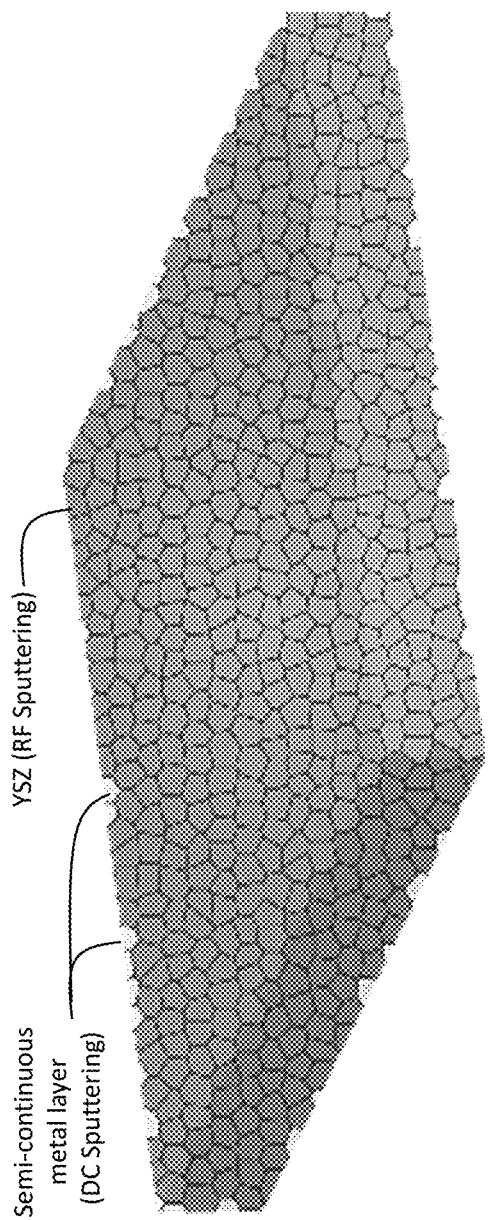
FIG. 2 is a magnified view of a portion of the composite structure of FIG. 1.

In FIG. 1, there is a reference to FIG. 2 which provides a magnified view of one of the composite structure (e.g., the 1$^{st}$ YSZ layer 104$_1$ and 1$^{st}$ metal layer 106$_1$) for a closer inspection. Referring to FIG. 2, a schematic of a meta-barrier structure is provided which includes nano-islands i.e. semicontinuous metal like structures, which as discussed above represents an ultra-thin disordered semi-continuous metallic-alloy film which is selected from the group consisting of Ag, Al, W, Ti and a combinations thereof, provided with high plasma frequency and low inter-band absorption. These are also disordered similar to the porous YSZ and simultaneously ultra-subwavelength (about 20 nm), causing substantial suppression of net electronic thermal transport.

The meta-barrier layers of the present disclosure are deeply encapsulated within the YSZ host matrix for structural stability and high melting point. Additional oxidation and corrosion resistance are advantageously provided by the meta-barrier layers using co-deposition of the nano-island thin films with tungsten carbide (WC) that retain the screening properties of high plasma frequency metals such as Ag, Al or W, Ti, and combinations thereof.

Figure 3:
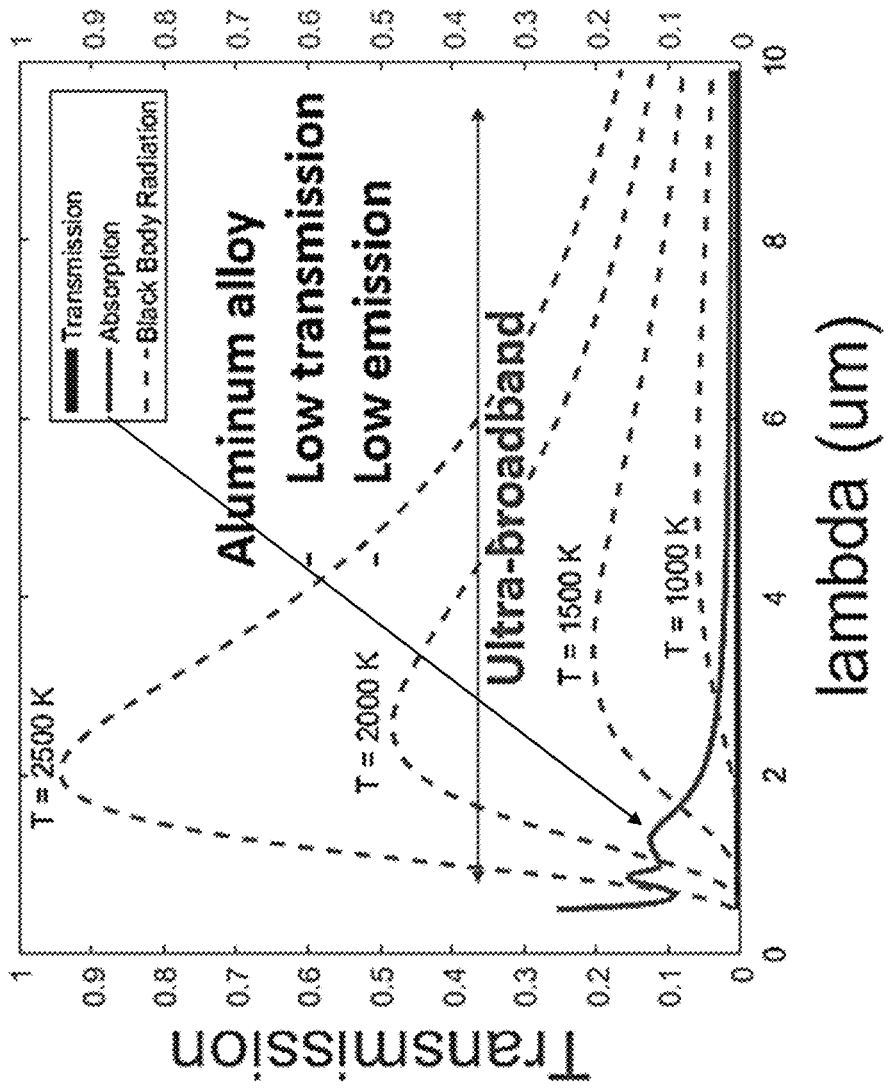
FIG. 3 is a graph of thermal transmission as a function of wavelength (in μm).

The ultrabroadband reflectivity of the TDBC system of the present disclosure is shown in FIG. 3, which is a graph of thermal transmission as a function of wavelength (in μm). The structure shown in FIGS. 1 and 2 provide an ultrabroadband high reflectivity, low transmissivity and low self-thermal radiation emission towards the structure to be protected, e.g., nickel super-alloy, within 0.5 μm<λ<20 μm. The self-thermal-emission from this 60 micron layer is also prohibited from reaching the cold protected side.

According to one embodiment, a layer-by-layer magnetron sputtering of YSZ and DC sputtering of metals (Ag, Al, W, Ti, and combinations thereof) is deployed for the fabrication of the structure shown in FIGS. 1 and 2. Additionally, a scalable co-sputtering technique where the meta-barrier layers are co-deposited with tungsten carbide is utilized to generate thermal metamaterials with ultra-thin metal alloy layers that optimize the stability of the coating in extreme harsh environments.

One of the challenges for stability analysis of metamaterials at high temperature is the protection of the refractory metals against oxidation. However, the oxide scale could be either protective against further oxidation or porous, allowing oxygen permeation and continuation of the oxidation process.

Figure 4:
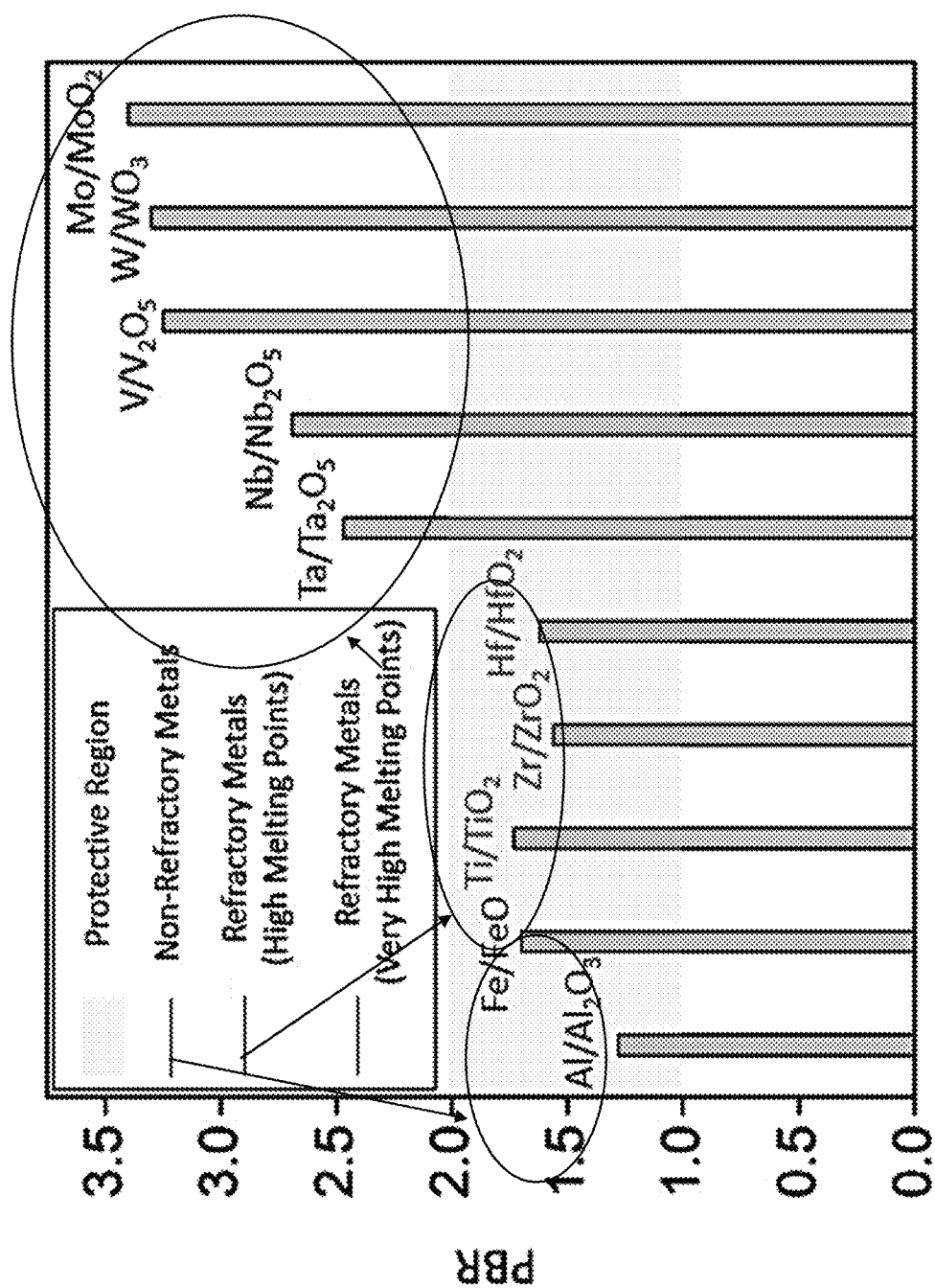
FIG. 4 is a graph of Pillinge Bedworth ratio (PBR) for various metal/metal oxide systems.

A general indicator of the protectiveness of the oxide scale is given by the Pillinge Bedworth ratio (PBR). It is defined by the ratio of volume of oxide formed to the volume of metal consumed. PBR values of some metal oxide systems and the protectiveness of the oxide scale are shown in FIG. 4 which is a graph of PBR for various metal/metal oxide systems. If PBR is significantly below 1, the volume of oxide formed is less than the volume of the metal consumed. To conform to the underlying metal, the oxide needs to be porous and hence nonprotective. If PBR is between 1 and 2, the scale is protective. If PBR is significantly higher than 1, the oxide volume is greater than the volume of the metal replaced. The oxide scale is highly compressed, resulting in buckling and spalling. Exposure of a fresh metal surface perpetuates continued oxidation. Thus, for an oxide scale to be protective, PBR should be close to unity. From FIG. 4, it is clear that Ti, Zr, and Hf provide a superb choice for the metamaterials.

Figure 5:
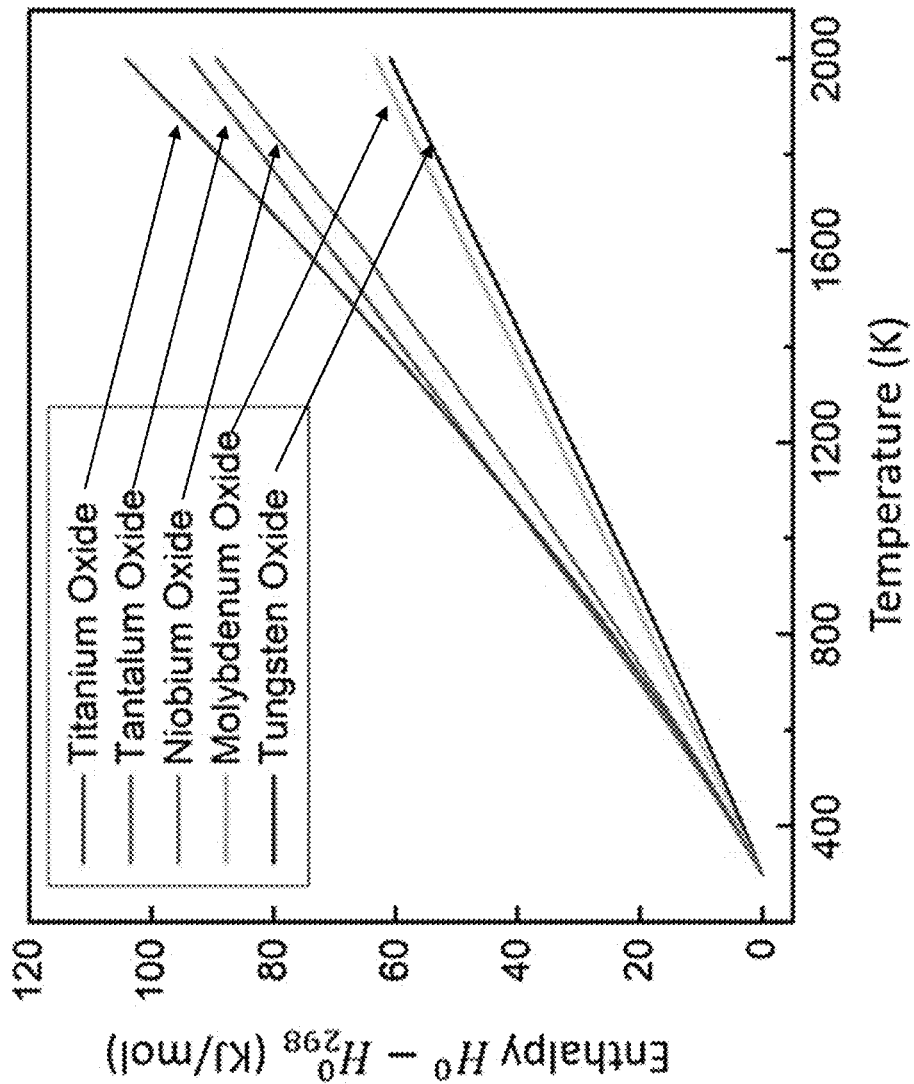
FIG. 5 is a graph of enthalpy vs. temperature in ° K.

Additionally, the enthalpy of formation of oxides of different refractory materials are also of concern and shown in FIG. 5 which is a graph of enthalpy vs. temperature in ° K. FIG. 5 reveals that titanium oxide (TiO$_2$) has a higher value of enthalpy compared to other refractory oxides. FIG. 5 provides enthalpy data of oxides formation of different refractory metals. The data were collected from the National Institute of Standards and Technology (NIST) chem web book using Shomate equation.

Figure 6:
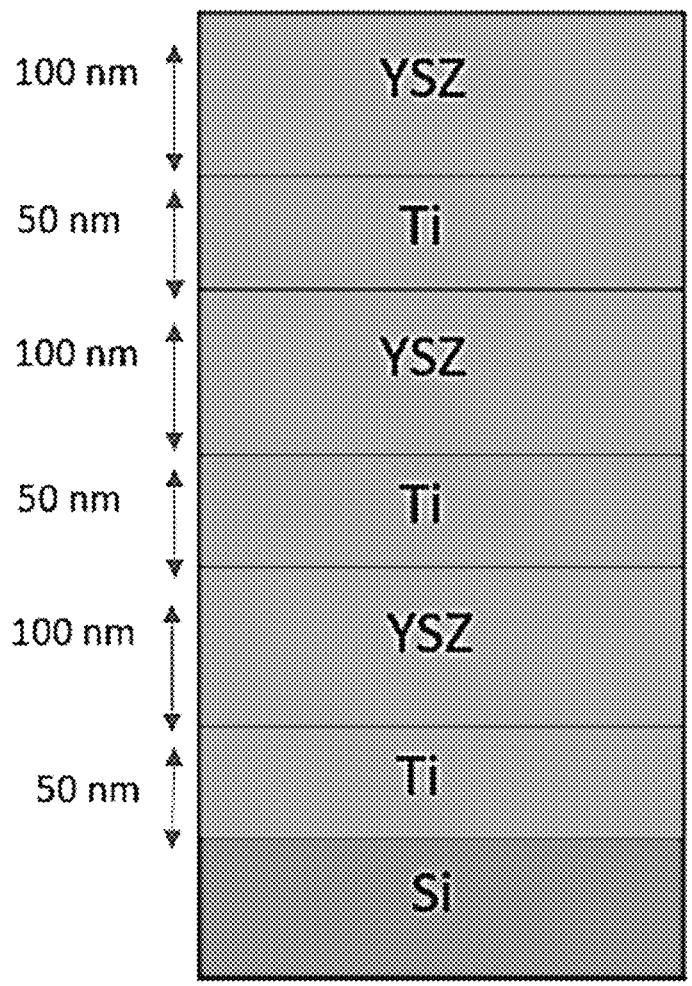
FIG. 6 is a schematic of 3× composite structure of FIG. 1.

Both the above plots of PBR ratio (FIG. 4) and enthalpy of oxides formation of the refractory metals (FIG. 5) reveal that Ti is a good candidate for metamaterial for high temperature thermal stability, leading to building YSZ/Ti metamaterial structure with 3 unit cell metamaterials as shown in FIG. 6 which is a schematic of the (YSZ/Ti)×3/Si metamaterial structure, where Ti and YSZ thicknesses were chosen in a non-limiting fashion to be about 100 nm and 50 nm, respectively and which are deposited on Si as an embodiment.

Figure 7:
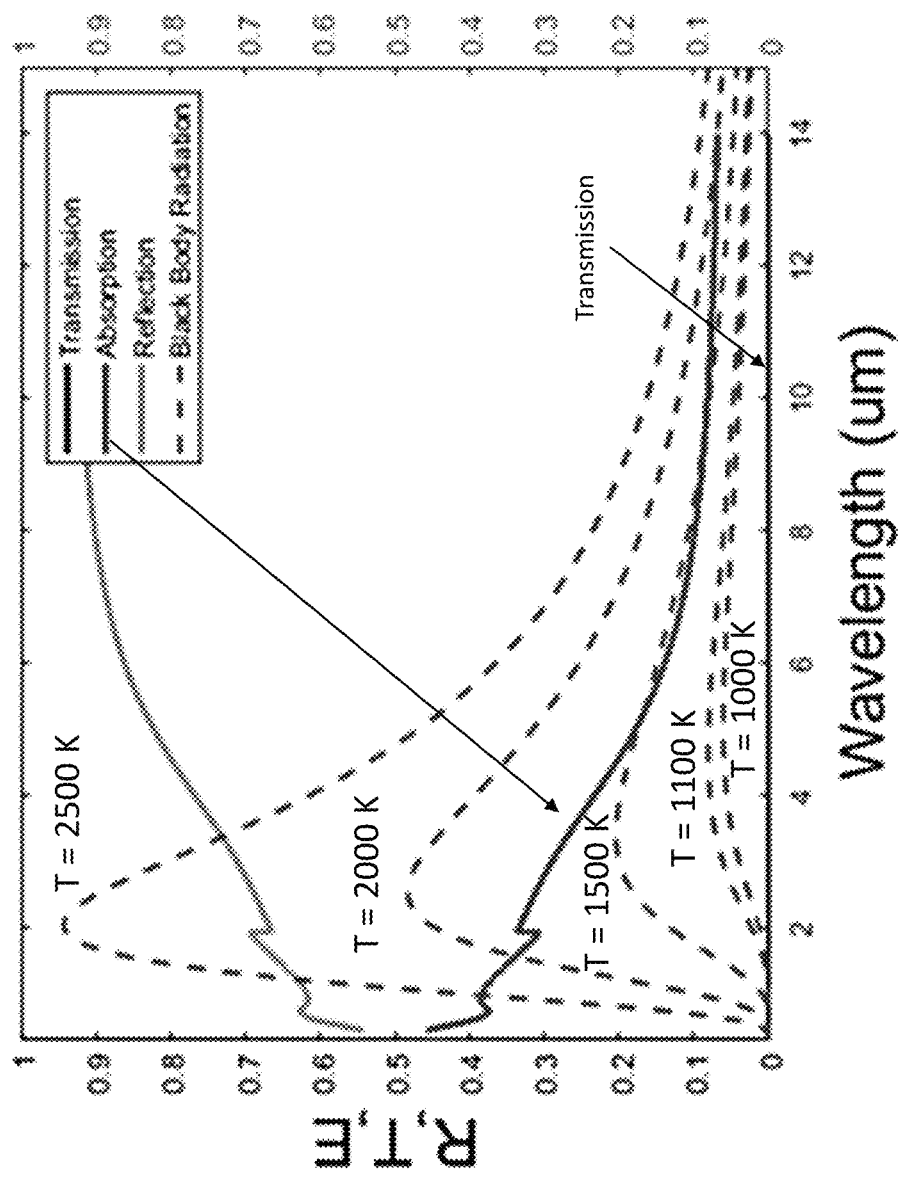
FIG. 7 is a graph of reflection (R), transmission (T), and emission (E) characteristics in a Ti/YSZ structure generated using simulations.

In order to investigate transmission, COMSOL was used to generate simulations. Transmission and absorption are quite low while the reflection is high for the YSZ/Ti metamaterials which are desirable traits for high temperature applications, as shown in FIG. 7 which is a graph of reflection (R), transmission (T), and emission (E) characteristics in Ti/YSZ structure generated using COMSOL simulations.

According to one embodiment, the TDBC of the present disclosure is fabricated according to the following steps. Initially 3-unit-cell metamaterials was sputtered with Ti thicknesses of 50 nm and YSZ thicknesses of 100 nm. The YSZ/Ti based metamaterial structure is schematically shown in FIG. 6. The sputtering conditions are listed in Table I below.

TABLE I

| Sputtering Conditions for Deposition of Ti and YSZ Layers | | |
|---|---|---|
| | Separate single layers | |
| | YSZ | Ti |
| Pressure | 3.2-3.3 mT | 3.3 mT |
| Thickness | 100 nm | 50 nm |
| Substrate | Si, | Si |
| Gas flow | 15 sccm Ar | 15 sccm Ar |
| Time | 27 min | 12 min |
| Power | 120 W | 80 W |

Figure 8A:
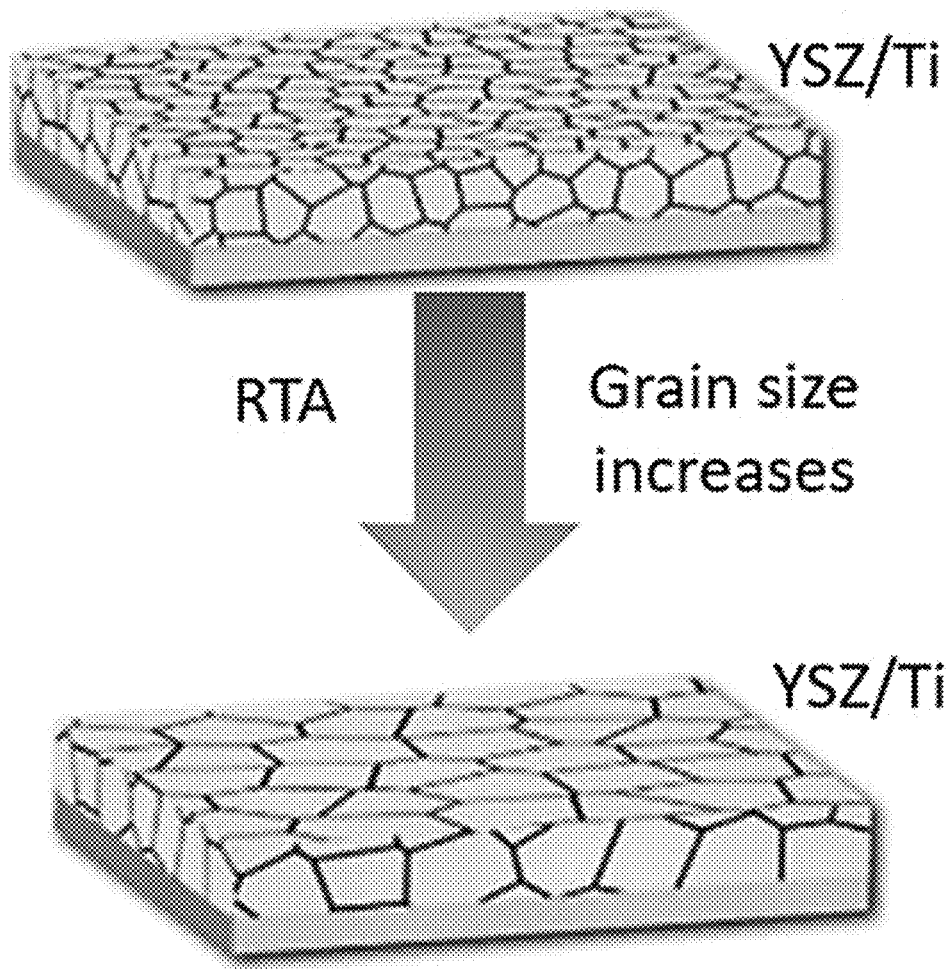
FIG. 8a is a schematic of the mechanism behind rapid thermal annealing.
Figure 8B:
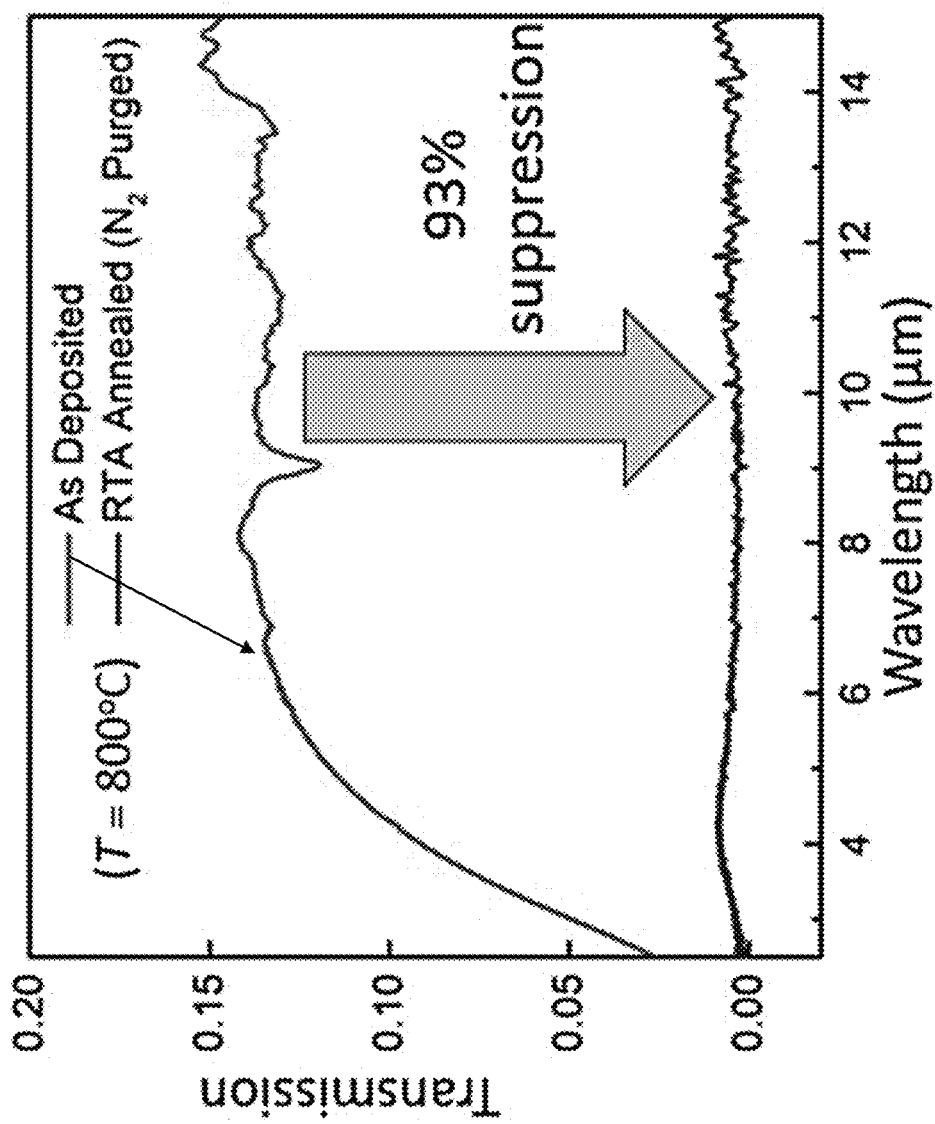

After fabricating the samples, the sample were annealed in the Jipolec rapid thermal annealing (RTA) setup in vacuum at 800° C. for 30 s. Some of the annealed samples were then annealed again in the Jipolec RTA but in N$_2$ in atmospheric pressure at 800° C. for 5 minutes. It was observed that the transmission properties were significantly suppressed (about 93%) as a result of RTA, attributed to the increase in grain size, as also shown in FIG. 8a, which is a schematic of the mechanism behind RTA, resulting in transmission properties shown in FIG. 8b which is a graph of transmission vs. wavelength for before and after annealing in RTA.

To study the stability of the fabricated TDBC, the YSZ/Ti metamaterials was placed in an annealing furnace (BLUE M furnace) where the temperature was set to 1000° C. The process gas was $N_2$ and the chamber pressure was 760 Torr. The annealing was carried out for 1 hr on the (YSZ/Ti)×3/Si for characterization of their transmission and material properties.

Figure 9:
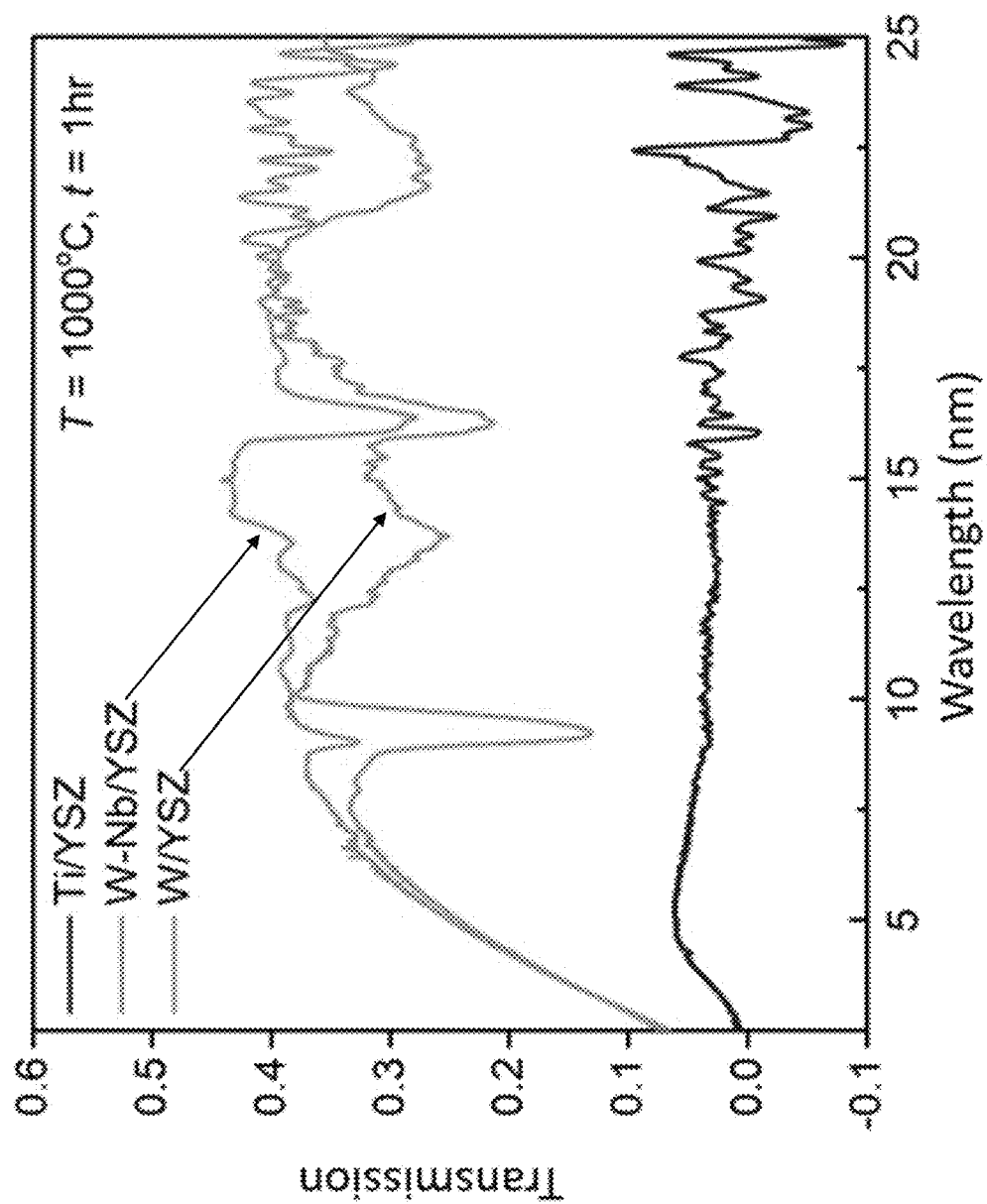
FIG. 9 is a graph of transmission vs. wavelength in nm which shows Transmission characteristics of Ti- and W-based metamaterial after annealing.

It was observed that the Ti-based metamaterials retain its low transmission properties even after annealing at T=1000° C. in $N_2$ purged environment. The transmission characteristics of (YSZ/Ti)×3/Si when compared with W-based metamaterials after annealing is shown in FIG. 9, which is a graph of transmission vs. wavelength in nm which shows Transmission characteristics of Ti- and W-based metamaterial after annealing.

Figure 10A:
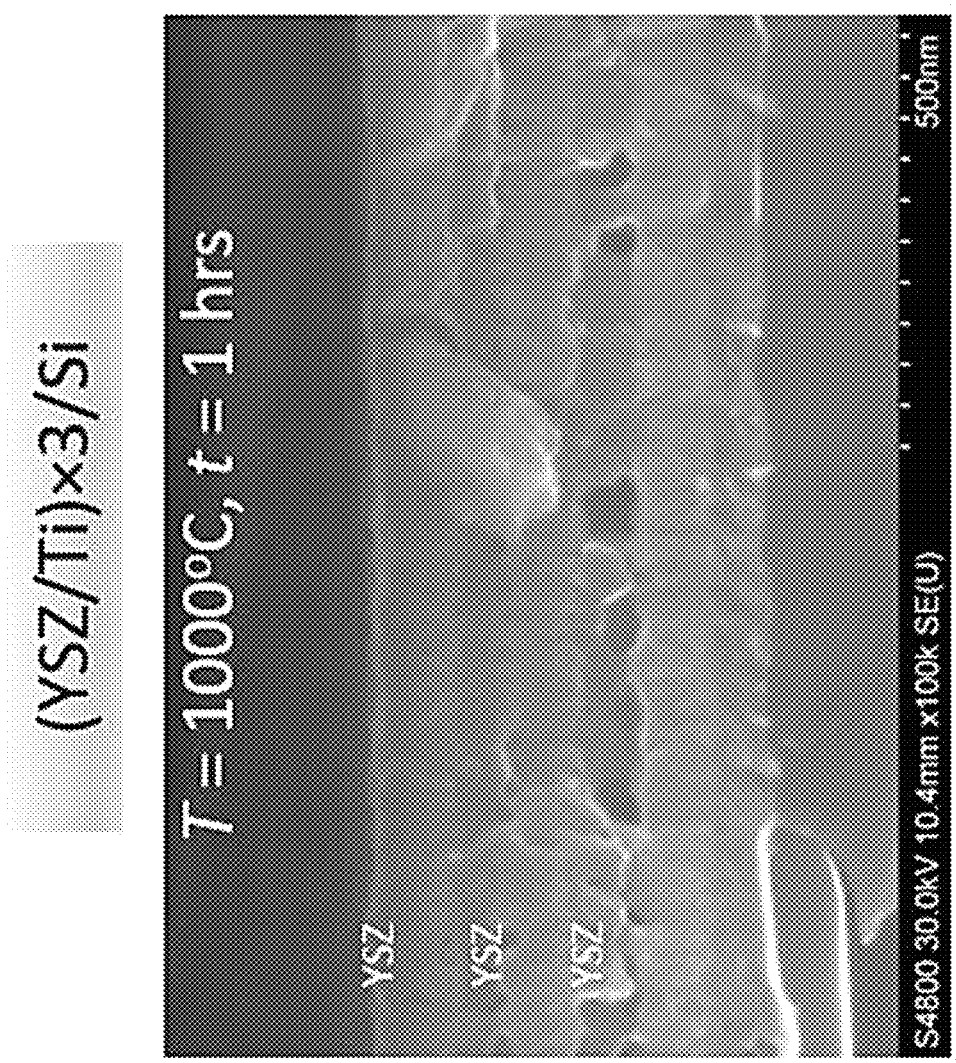
FIGS. 10a, 10b, and 10c, are scanning electron microscope (SEM) images of the (YSZ/Ti)×3/Si (FIG. 10a), (W–Nb/YSZ)×3/Si (FIG. 10b), and (W/YSZ)×3/Si (FIG. 10c) each after annealing at T=1000° C. for about 1 hr.
Figure 10B:
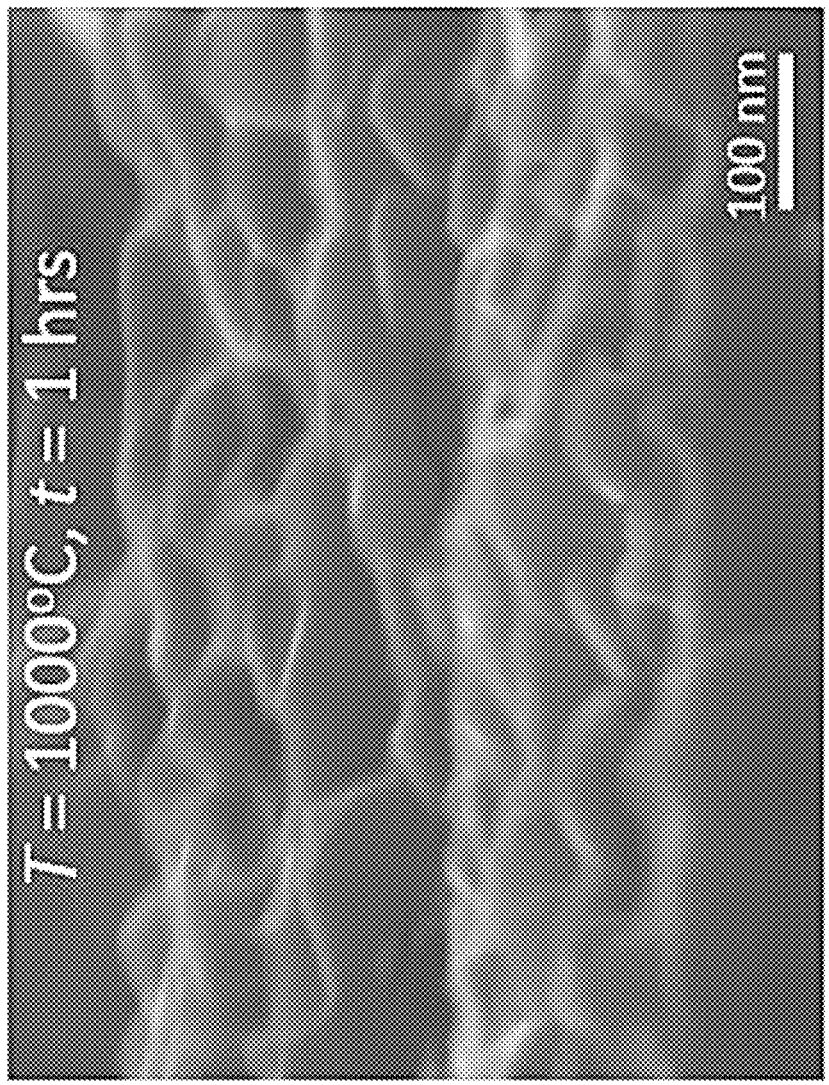
Figure 10C:
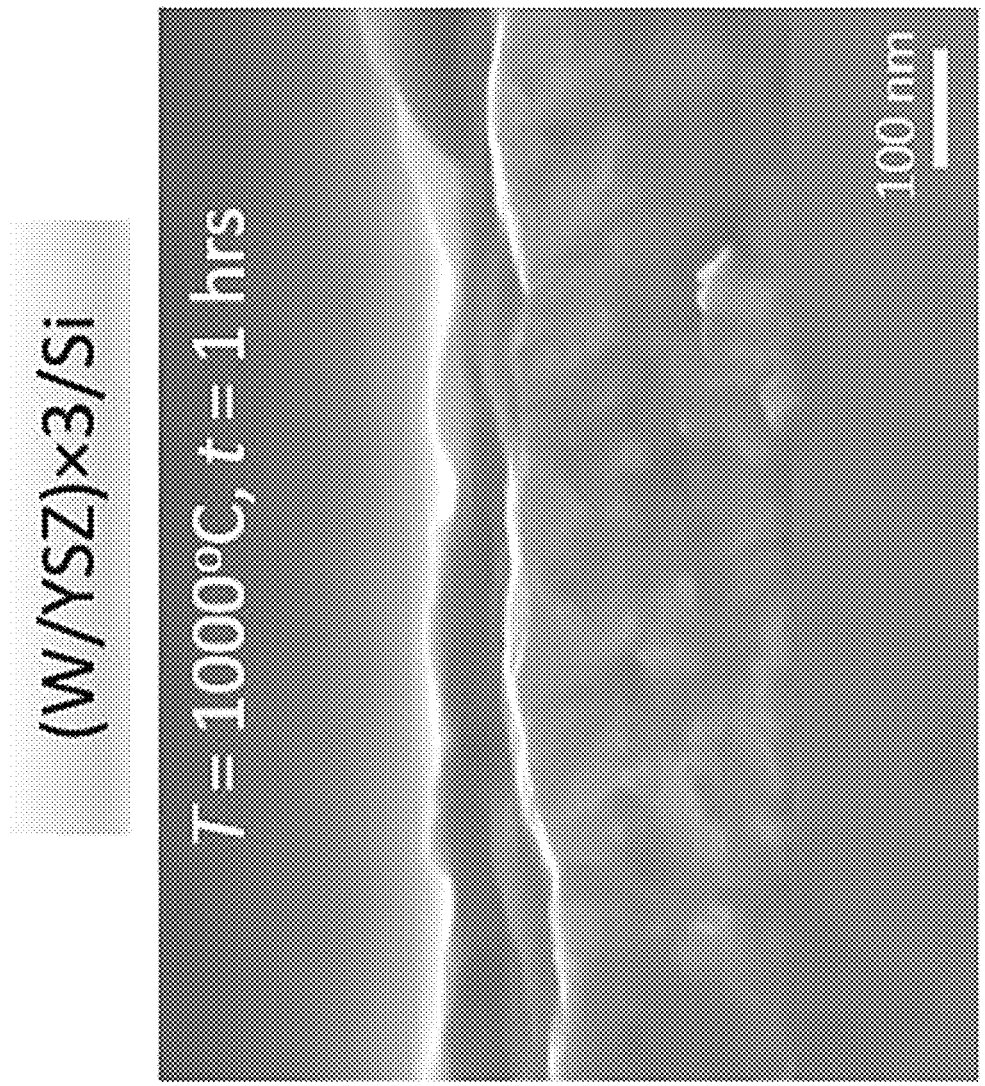

Scanning electron microscope (SEM) images of the Ti- and W-based metamaterials after annealing at T=1000° C. are also shown in FIGS. 10a, 10b, and 10c, which are SEM images of the (YSZ/Ti)×3/Si (FIG. 10a), (W−Nb/YSZ)×3/Si (FIG. 10b), and (W/YSZ)×3/Si (FIG. 10c) each after annealing at T=1000° C. for about 1 hr, from which it is clearly evident that the different layers in Ti-based metamaterials can be distinguished when compared with W-based metamaterials where the layers degraded.

Figure 11:
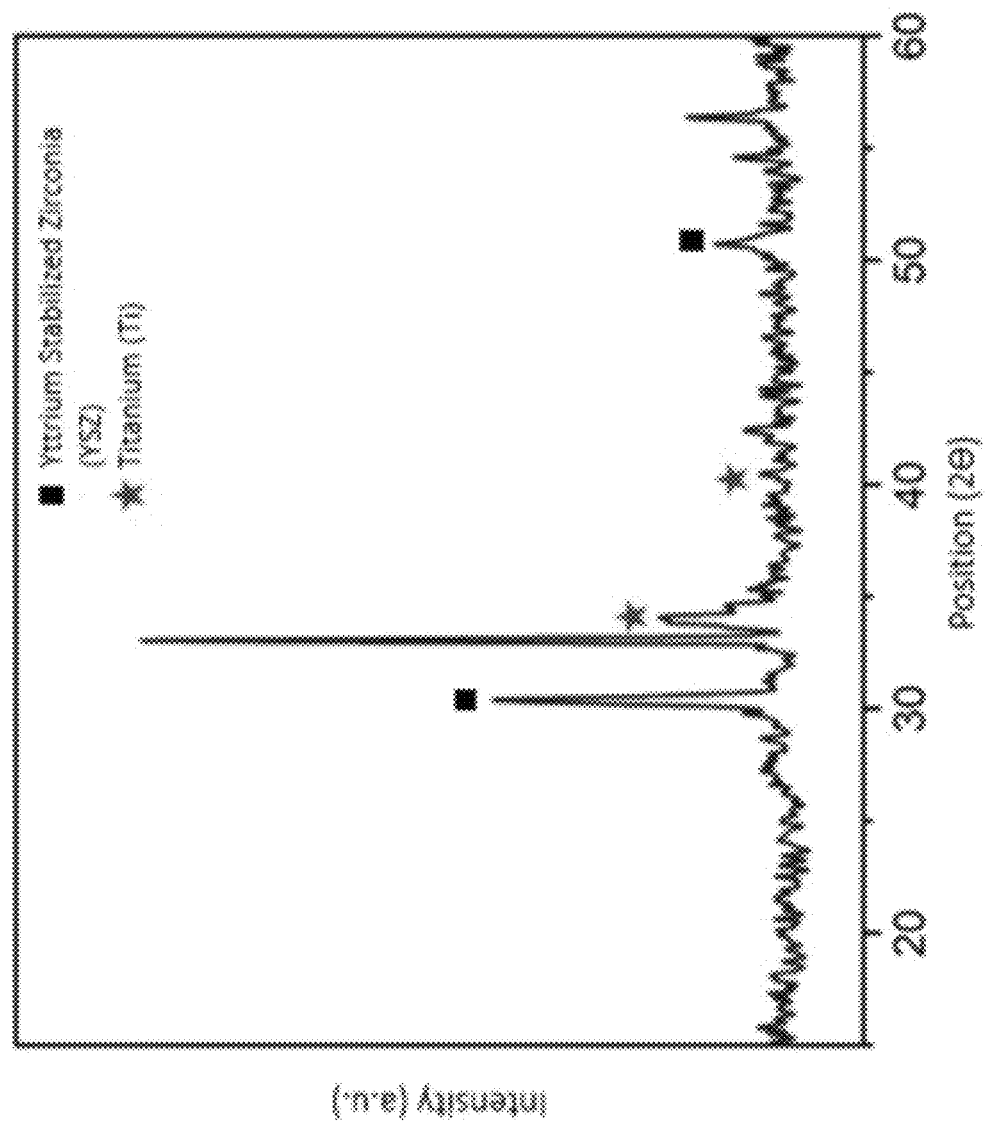
FIG. 11 is graph of intensity vs. position showing an X-ray diffraction (XRD) plot of the (YSZ/Ti)×3/Si metamaterial structure before annealing.

In addition to SEM study, X-ray diffraction (XRD) analysis was also carried out on the (YSZ/Ti)×3/Si samples before and after annealing to understand the chemical compositions formed due to high temperature annealing. The XRD data was utilized in conjunction with the International Centre for Diffraction Data (ICDD) database to match the compounds. Towards this end, The XRD plot of the (Ti/YSZ)×3/Si before the annealing is shown in FIG. 11, which is graph of intensity vs. position showing an XRD plot of the (YSZ/Ti)×3/Si metamaterial structure before annealing from which the signature of YSZ and Ti was obtained.

Figure 12:
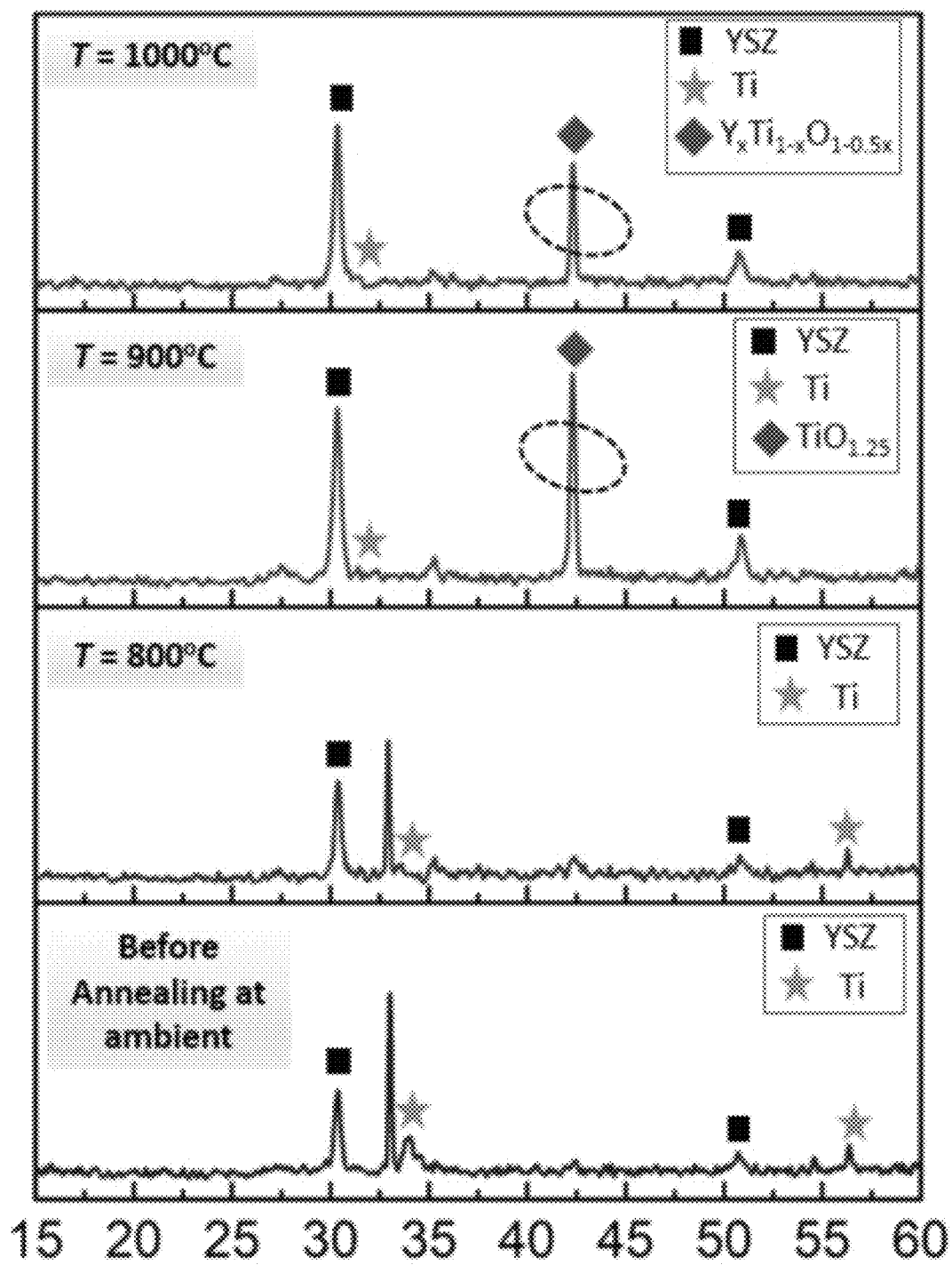
FIG. 12 is an XRD plot of the (YSZ/Ti)×3/Si metamaterial structure before and after annealing at T=800° C., T=900° C., T=1000° C.

Thereafter, XRD measurements were conducted on the (YSZ/Ti)×3/Si samples before and after annealing which results are shown in FIG. 12 which shows XRD plot of the (YSZ/Ti)×3/Si metamaterial structure before and after annealing at T=800° C., T=900° C., T=1000° C. The compositions obtained from the XRD analysis are described as follows:

1) At T=800° C., there was no signature of oxide peak, only Ti and YSZ peaks appeared in the samples;
2) At T=900° C., the signature of $TiO_{1.25}$ was obtained along with Ti and YSZ indicating moderate degradation in the samples; and
3) At T=1000° C., the signature of $Y_xTi_{1-x}TiO_{1-0.5x}$ was found along with Ti and YSZ indicating moderate degradation in the samples.

As discussed above, for W-based metamaterial structures, the W/YSZ metamaterials degraded after annealing at T=1050° C. at ambient pressure. The SEM image shows the degradation of the samples which are also shown for the reference. The XRD analysis on the sample from which the signature of $Y_{0.1}WO_3$ and $H_{0.23}WO_3$ were obtained in the degraded samples annealed at T=1050° C. as shown in FIG. 13 which shows XRD plot of the (W/YSZ)×3/Si metamaterial structure before and after annealing at T=1050° C.

Figure 13:
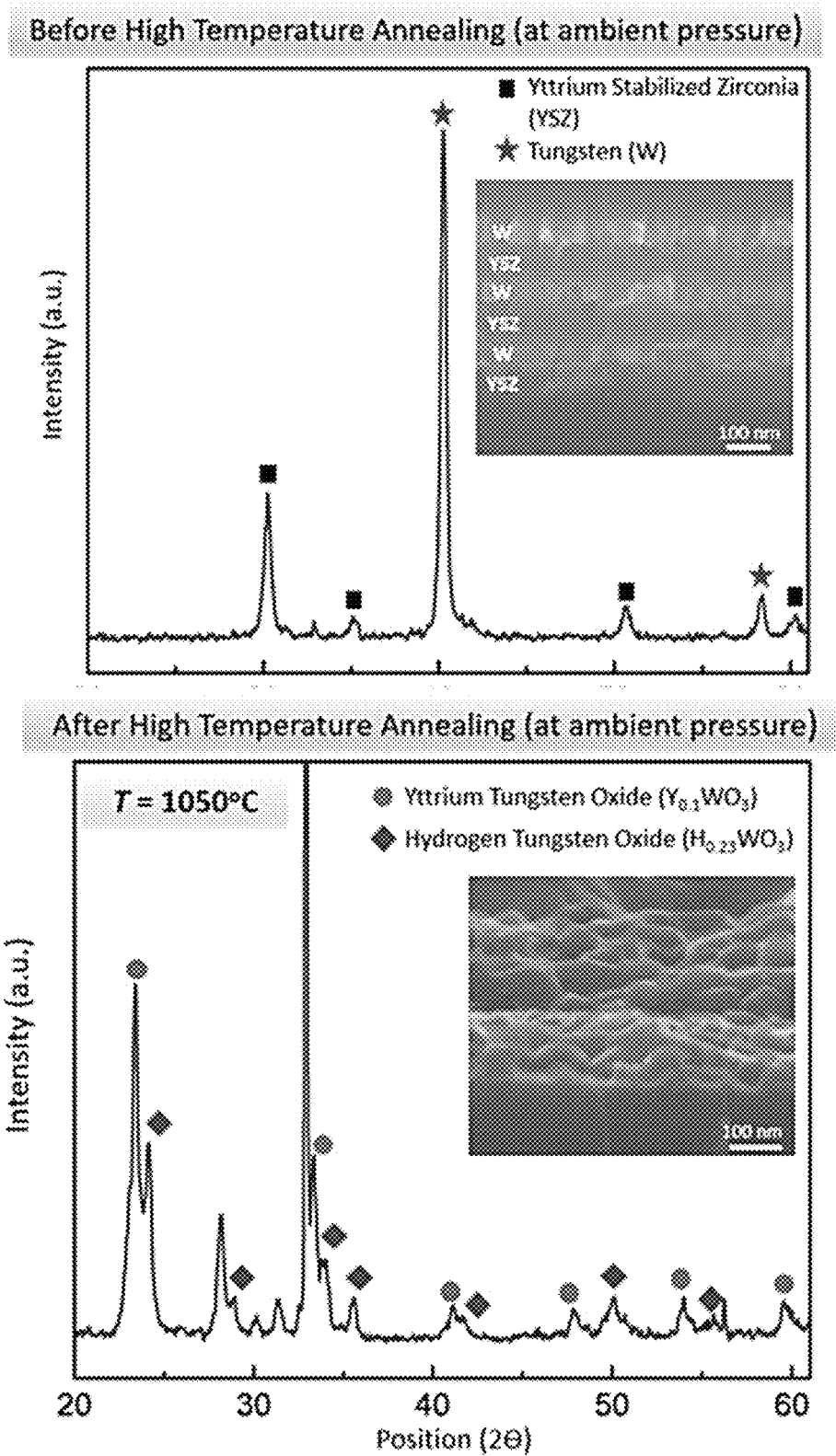
FIG. 13 is an XRD plot of the (W/YSZ)×3/Si metamaterial structure before and after annealing at T=1050° C.

Additionally, it was also observed that W−Nb/YSZ metamaterial based structure degraded after annealing at T=1050° C. at ambient pressure as shown in FIG. 13. The inset SEM images show the degradation of the samples which are also shown for the reference.

To study high-temperature stability study in Ti-based metamaterial in steam engine environment, a mixture of Ar and $H_2O$ was utilized in the high-temperature annealing system to create a steam engine environment inside the furnace chamber. Towards this end, Ar was used in place of $O_2$ with the wet oxidation setup. With the help of a temperature controller, water vapor is created and then Ar is flown through the water. The temperature in the bubbler temperature controller is set to about 95° C., and Ar and $H_2O$ vapor is then flown through the furnace inlet.

Figure 14A:
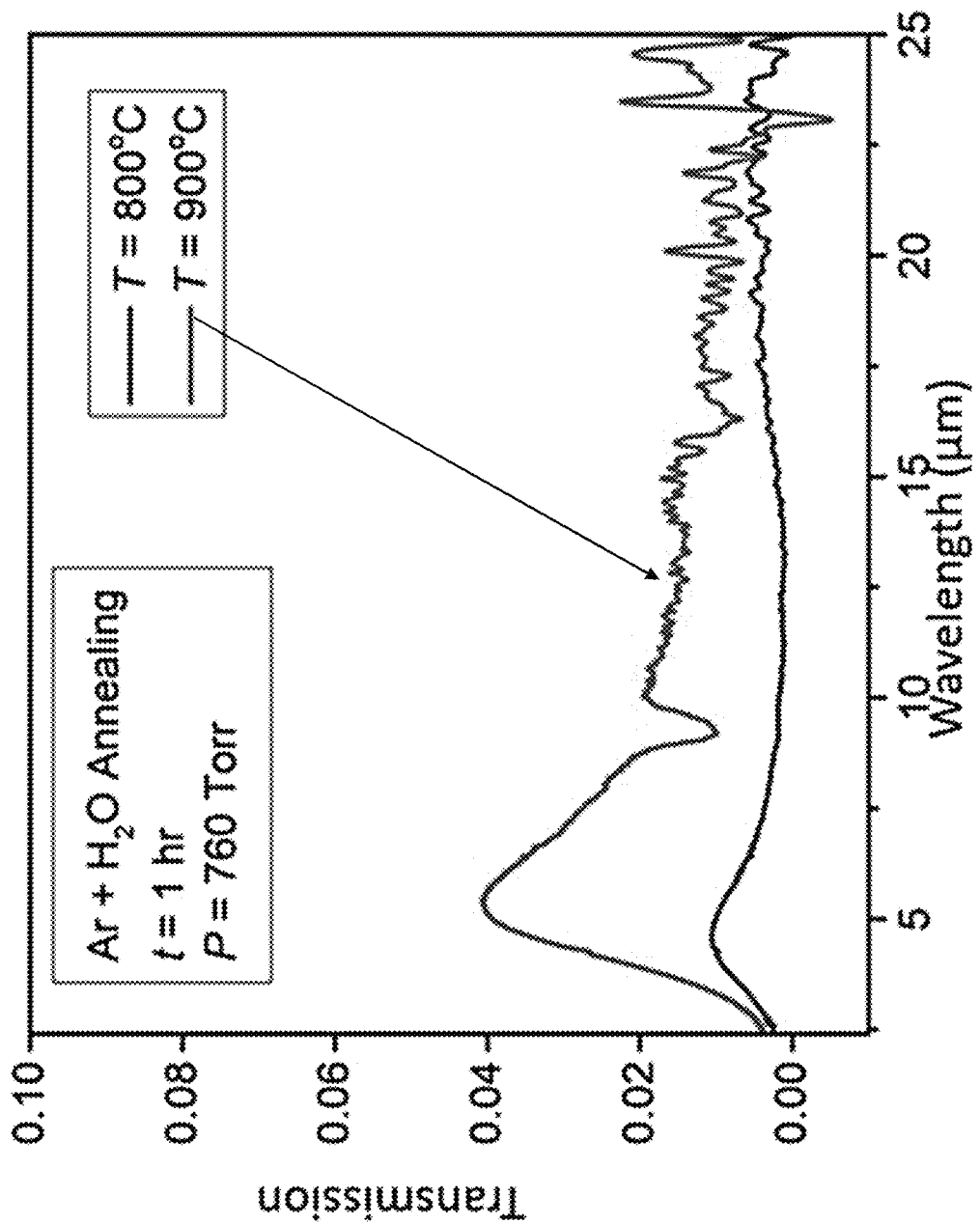
FIGS. 14a and 14b are graphs of transmission vs. wavelength showing transmission in (Ti/YSZ)×3/Si after annealing in Ar and $H_2O$ environment at T=800° C. and 900° C.
Figure 14B:
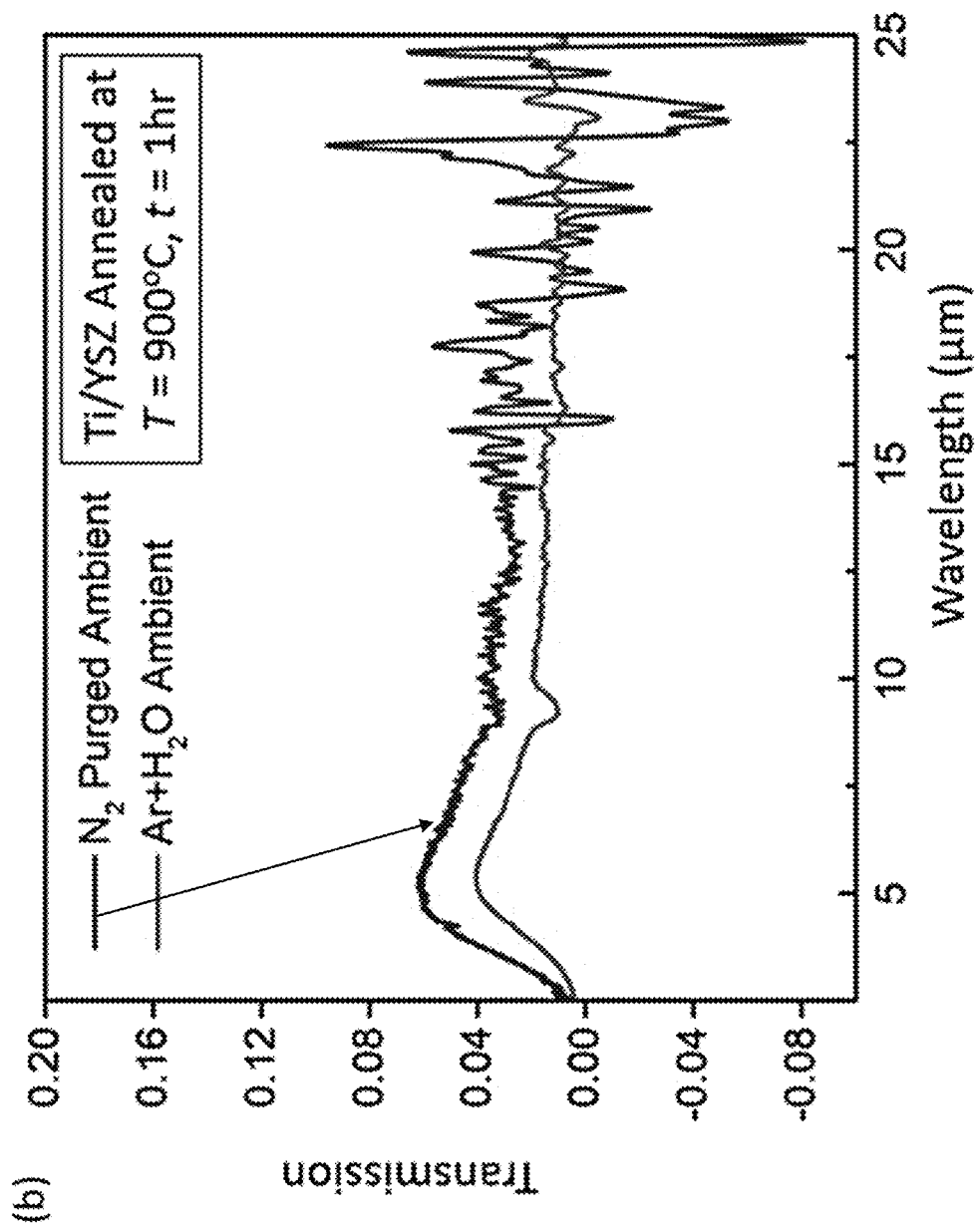

Thereafter, the transmission characteristics of the (Ti/YSZ)×3/Si sample were studied after annealing in Ar and $H_2O$ environment at T=800° C. and 900° C. for 1 hr. The transmissions were still found to be low after annealing in Ar and $H_2O$ environment. We also compared the transmission in (Ti/YSZ)×3/Si after annealing in Ar and $H_2O$ with $N_2$ purged environment and in both the cases the transmissions were found to within 10% which is shown FIGS. 14a and 14b, which are graphs of transmission vs. wavelength showing transmission in (Ti/YSZ)×3/Si after annealing in Ar and $H_2O$ environment at T=800° C. and 900° C. (FIG. 14a); and in $N_2$ purged ambient at T=900° C. for 1 hr (FIG. 14b).

Figure 15A:
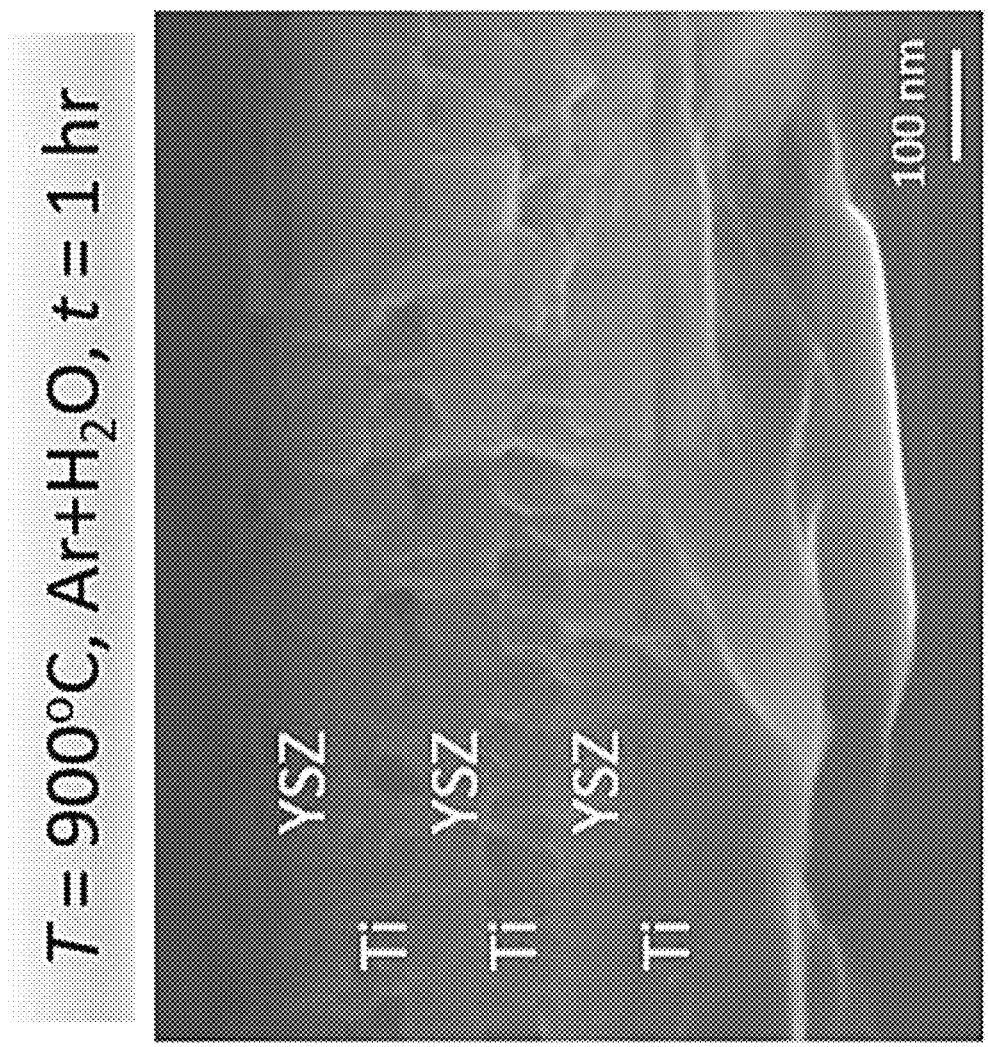
FIGS. 15a and 15b are SEM images at 900° C. and 800° C., respectively.
Figure 15B:
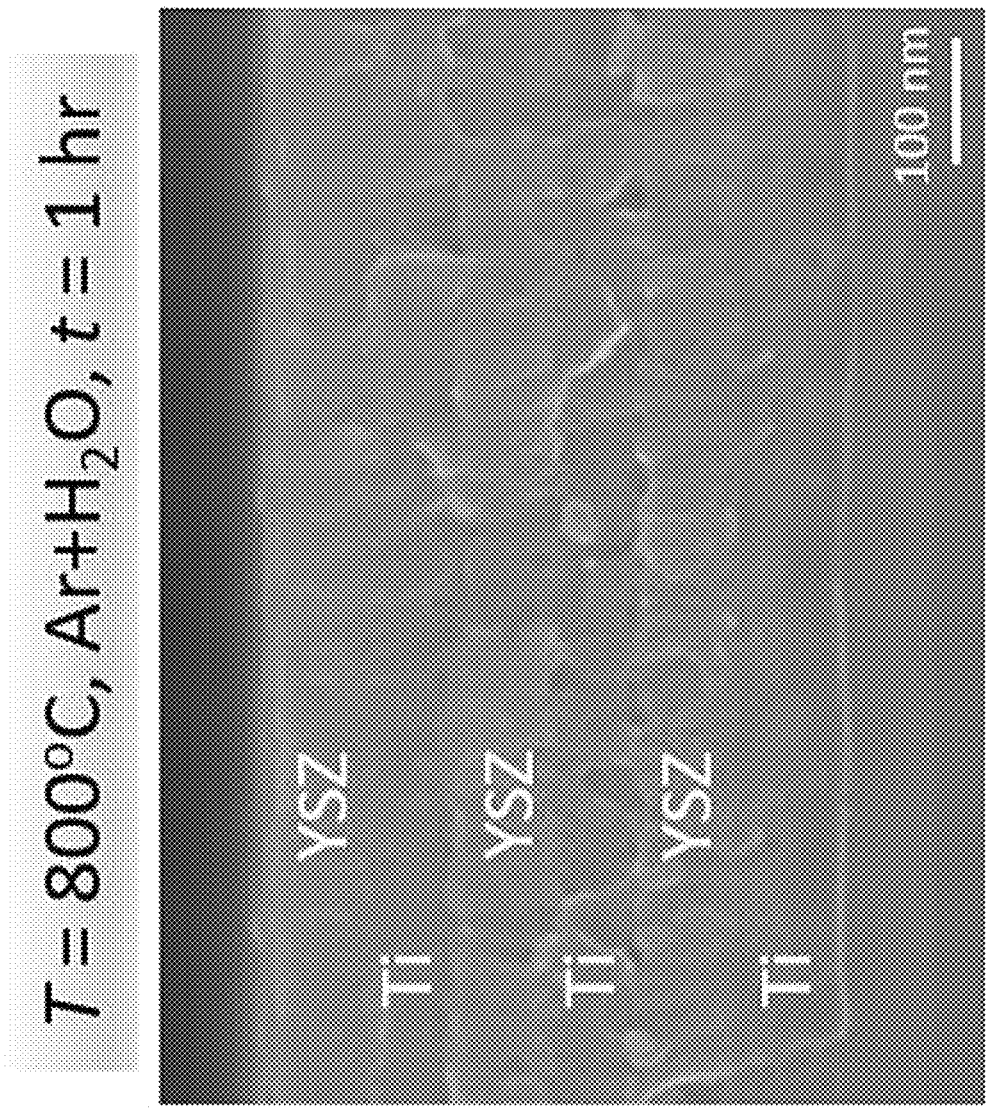
Figure 15C:
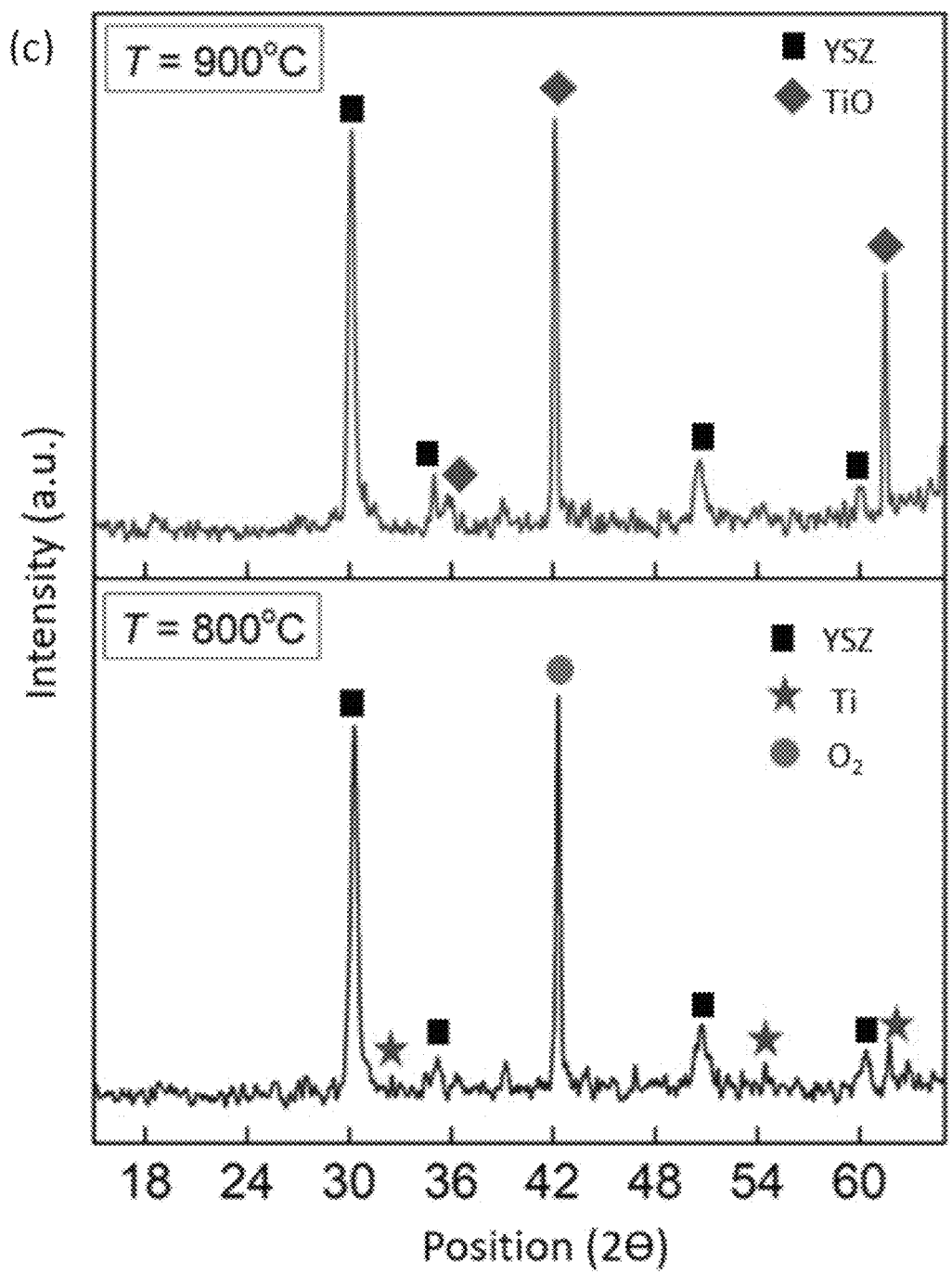
FIG. 15c is an XRD plot showing analysis of (Ti/YSZ)×3/Si samples after annealing.

Additionally, SEM characterization were also carried out of the (Ti/YSZ)×3/Si samples annealed at T=800° C. and T=900° C. as shown in the FIGS. 15a and 15b which are SEM images at 900° C. and 800° C., respectively. From the SEM images, the Ti and YSZ layers can be distinguished. Additionally, XRD characterizations of the sample from which we observed the signature of Ti, YSZ at T=800° C., and signature of YSZ and TiO at T=900° C. were also carried out with results shown in FIG. 15c which provides XRD analysis of (Ti/YSZ)×3/Si samples after annealing.

Figure 16A:
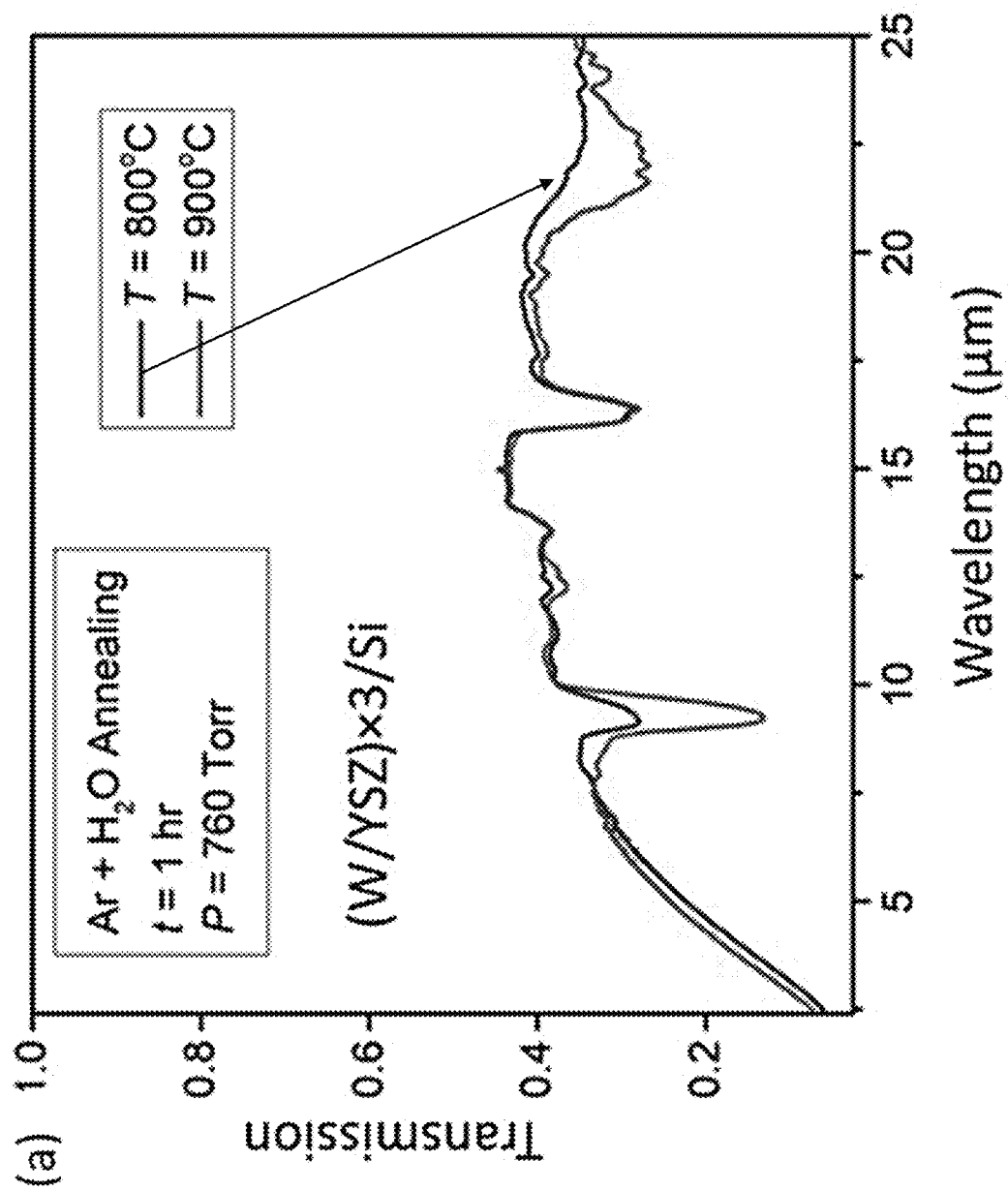
FIG. 16a is a graph of transmission at T=800° C. and T=900° C. for (W/YSZ)×3/Si with Ar and $H_2O$ annealing for 1 hr at a pressure of 760 Torr.
Figure 16B:
FIG. 16b is an SEM image of (W/YSZ)×3/Si after the annealing process.

Furthermore, the (W/YSZ)×3/Si samples were also characterized after annealing in Ar and $H_2O$ environment. The transmission was found to increase to 40%, while the SEM image show complete degradation of the layers as shown in FIGS. 16a and 16b which are graphs of transmission at T=800° C. and T=900° C. for (W/YSZ)×3/Si with Ar and $H_2O$ annealing for 1 hr at a pressure of 760 Torr (FIG. 16a); and SEM image of (W/YSZ)×3/Si after the annealing process (FIG. 16b).

Figure 17:
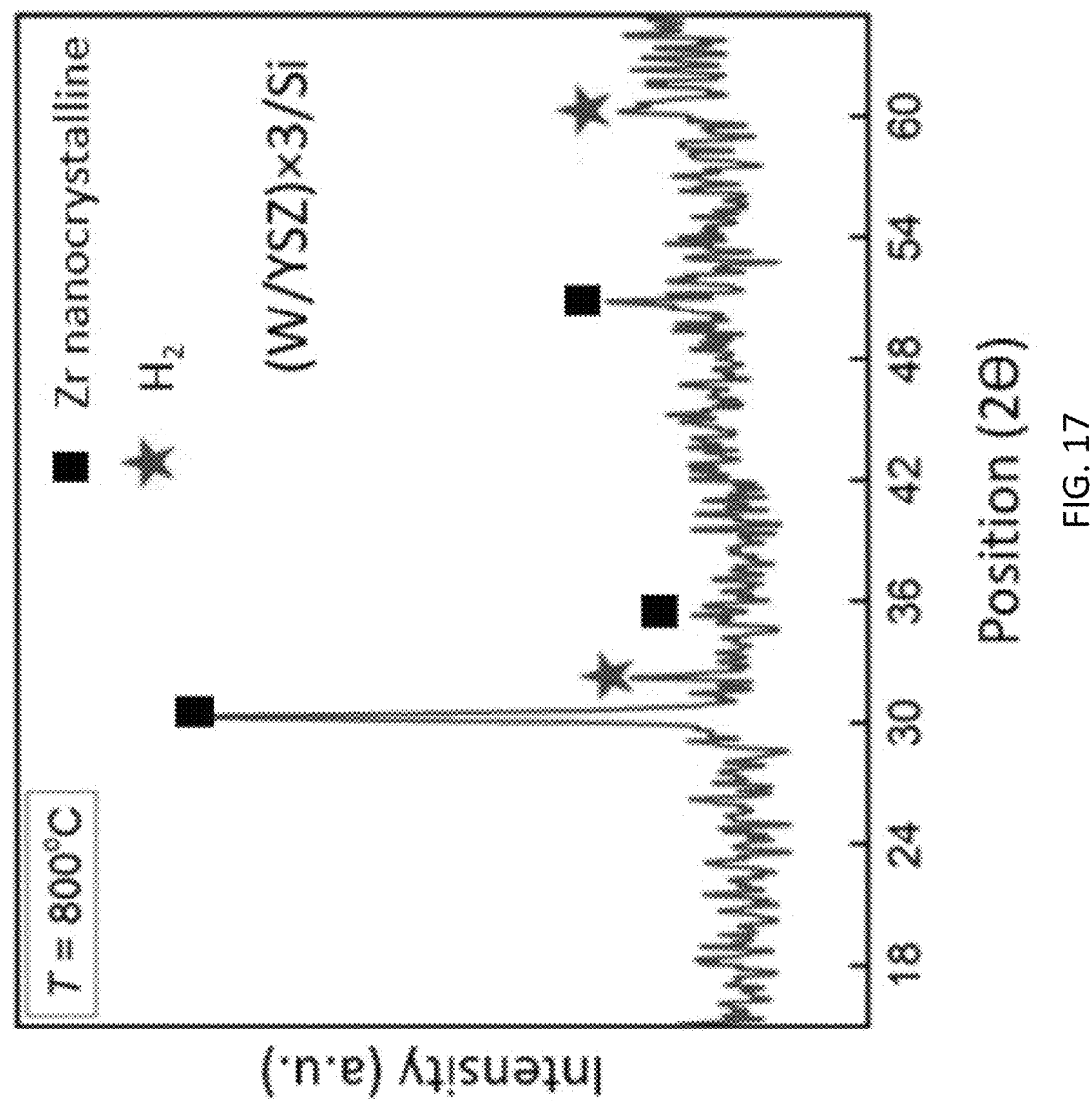
FIG. 17 is an XRD spectrum of (W/YSZ)×3/Si after the annealing.

The XRD analysis in (W/YSZ)×3/Si after annealing at T=800° C. in Ar and $H_2O$ purged ambient and shows the signature of Zr nanocrystalline and $H_2$ in the sample as also shown in FIG. 17 which is an XRD spectrum of (W/YSZ)×3/Si after the annealing.

During the high temperature annealing experiments, we have observed that sequential annealing of the sample at different temperatures yield better transmission properties compared to annealing of one sample at a particular temperature. We annealed one sample of YSZ/Ti metamaterial structure at 800° C. first and anneal it again at 900° C. and 1000° C. as shown in the figure. Then we measured the transmission characteristics of the sample and compared the results with other samples annealed directly at 900° C., and 1000° C. respectively. We observed that there was a suppression of 95% and 41% in the transmission at T=900° C., and 1000° C. with the sequential annealed sample as shown in FIGS. 18a and 18b which are graphs of transmission vs. wavelength for conventional (FIG. 18a) and sequential (FIG. 18b) annealing of the YSZ/Ti metamaterials at T=800° C., 900° C., and 1000° C.

Figure 18A:
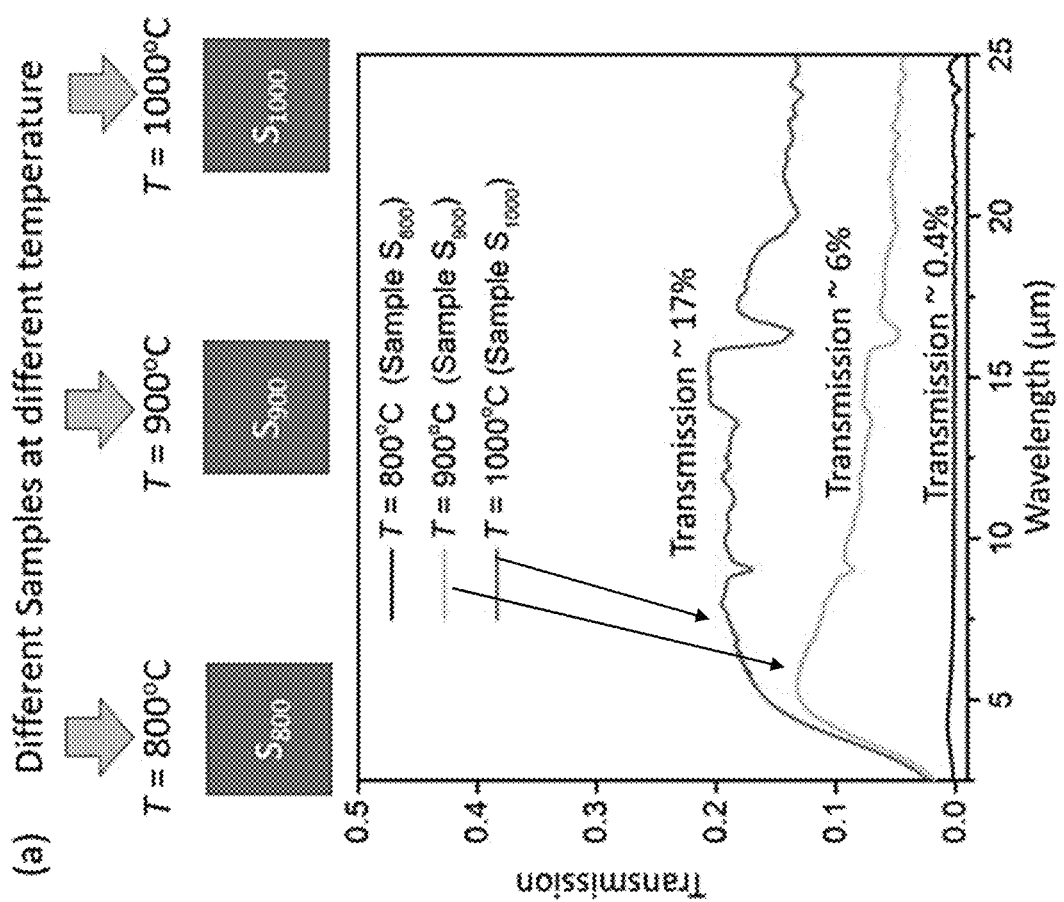
FIGS. 18a and 18b are graphs of transmission vs. wavelength for conventional (FIG. 18a) and sequential (FIG. 18b) annealing of the YSZ/Ti metamaterials at T=800° C., 900° C., and 1000° C.
Figure 18B:
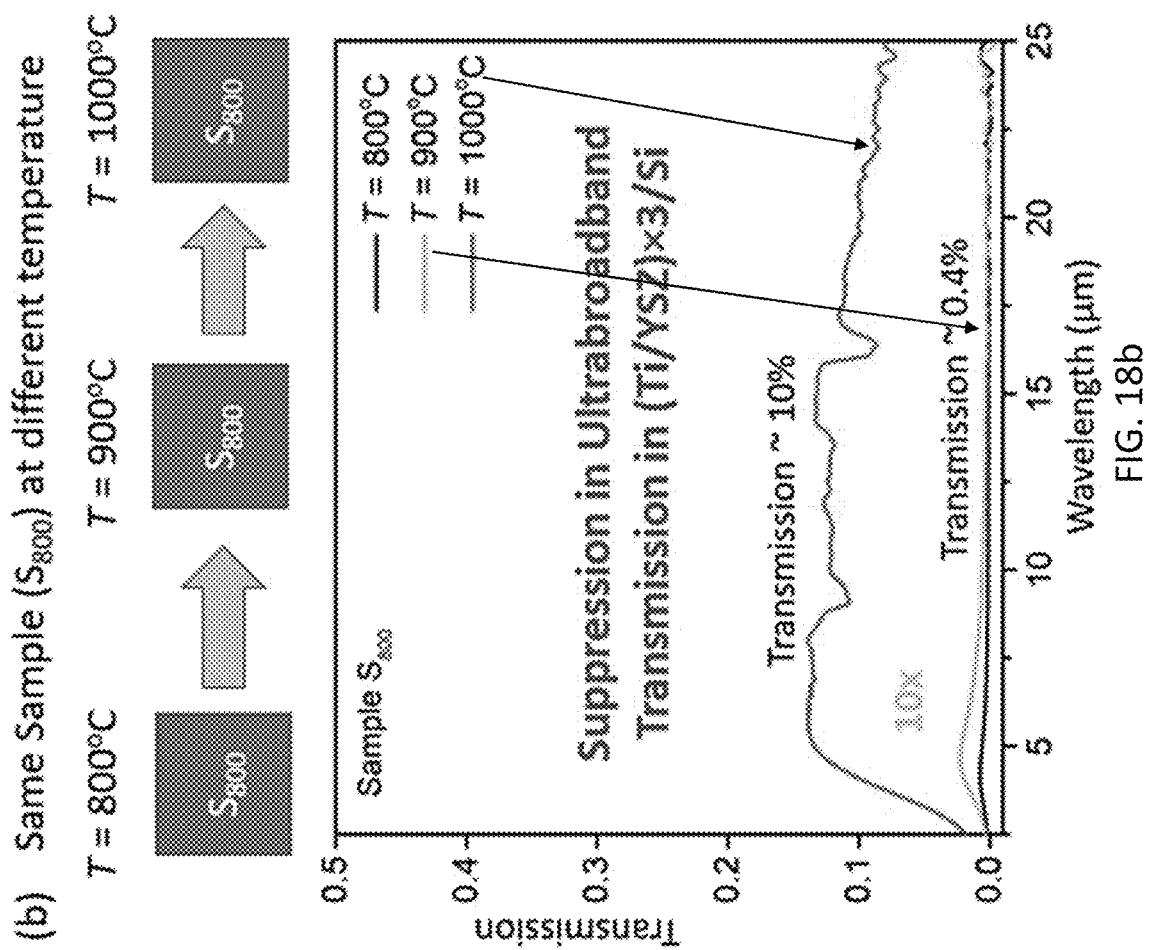
Figure 19:
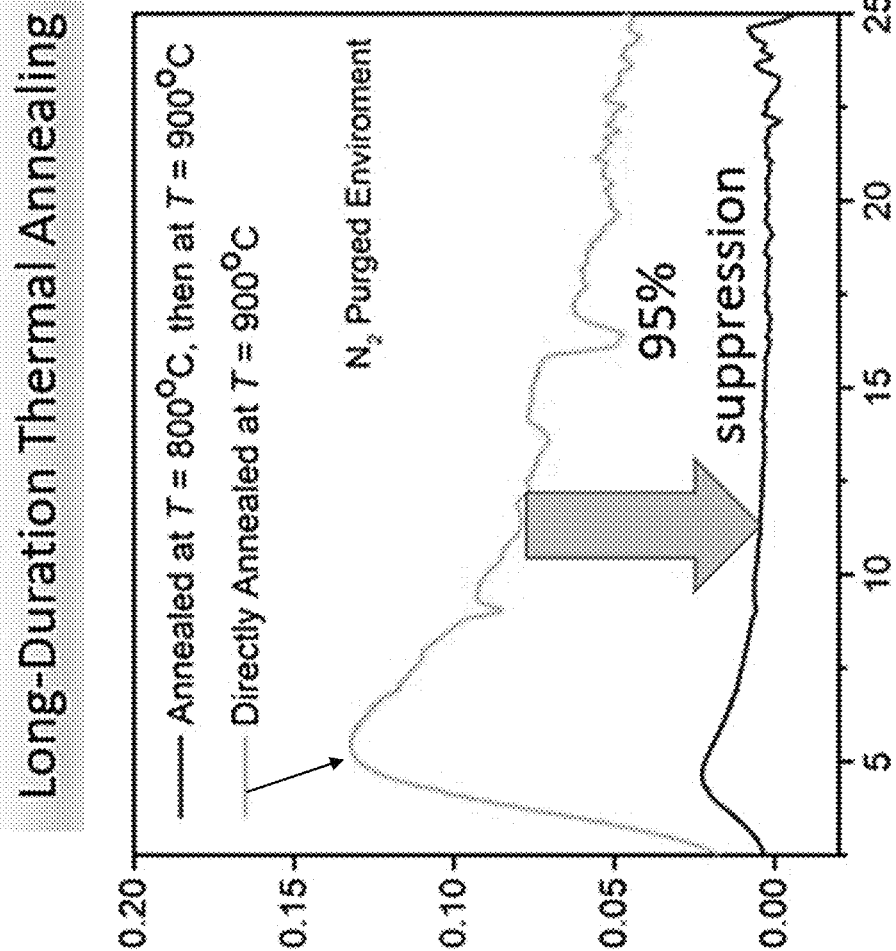
FIG. 19 is a graph that shows suppression in the transmission properties in RTA and long duration annealing with YSZ/Ti metamaterials.

The suppression of the transmission in the long duration annealing shown in FIGS. 18a and 18b are due to the fact that annealing helps in increasing the grain size leading to improvement in the optical properties. Similar suppression in transmission in the YSZ/Ti metamaterials during RTA were also observed, where a suppression of 93% in the transmission property was observed as also shown in FIG. 19, which is a graph that shows suppression in the transmission properties in RTA and long duration annealing with YSZ/Ti metamaterials.

Figure 20A:
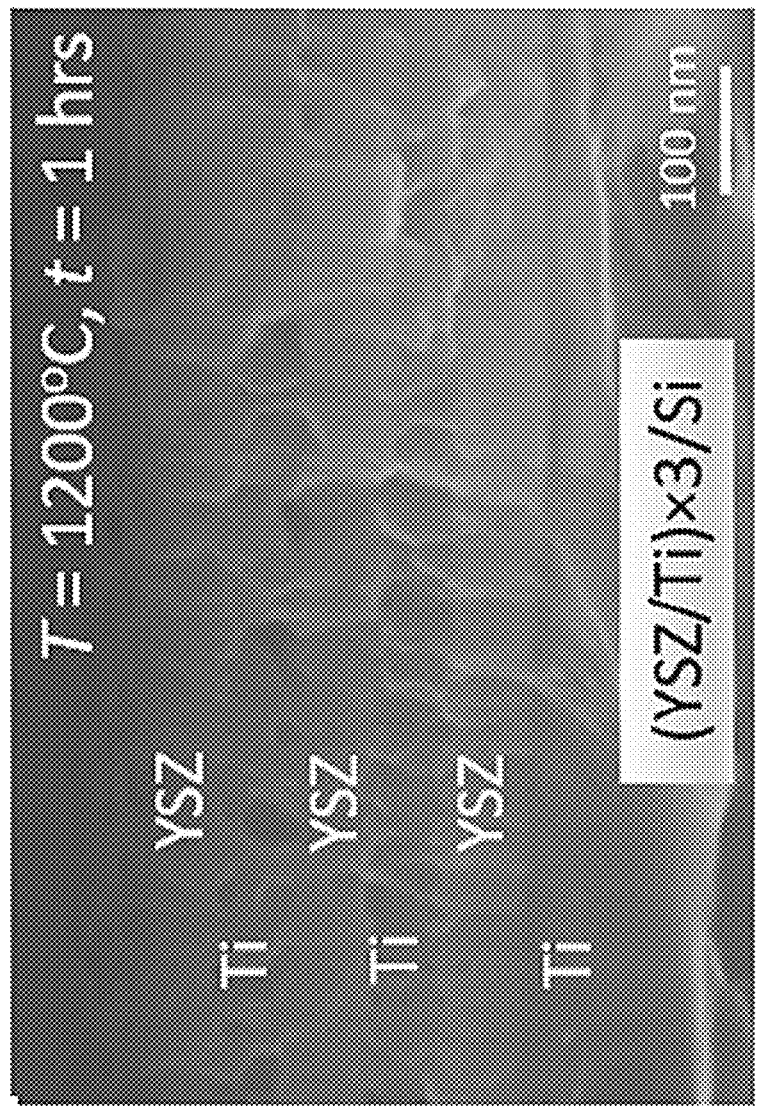
FIGS. 20a and 20b are an SEM image (FIG. 20a) and a graph of transmission vs. wavelength showing transmission properties of the YSZ/Ti Metamaterials at T=1200° C.
Figure 20B:
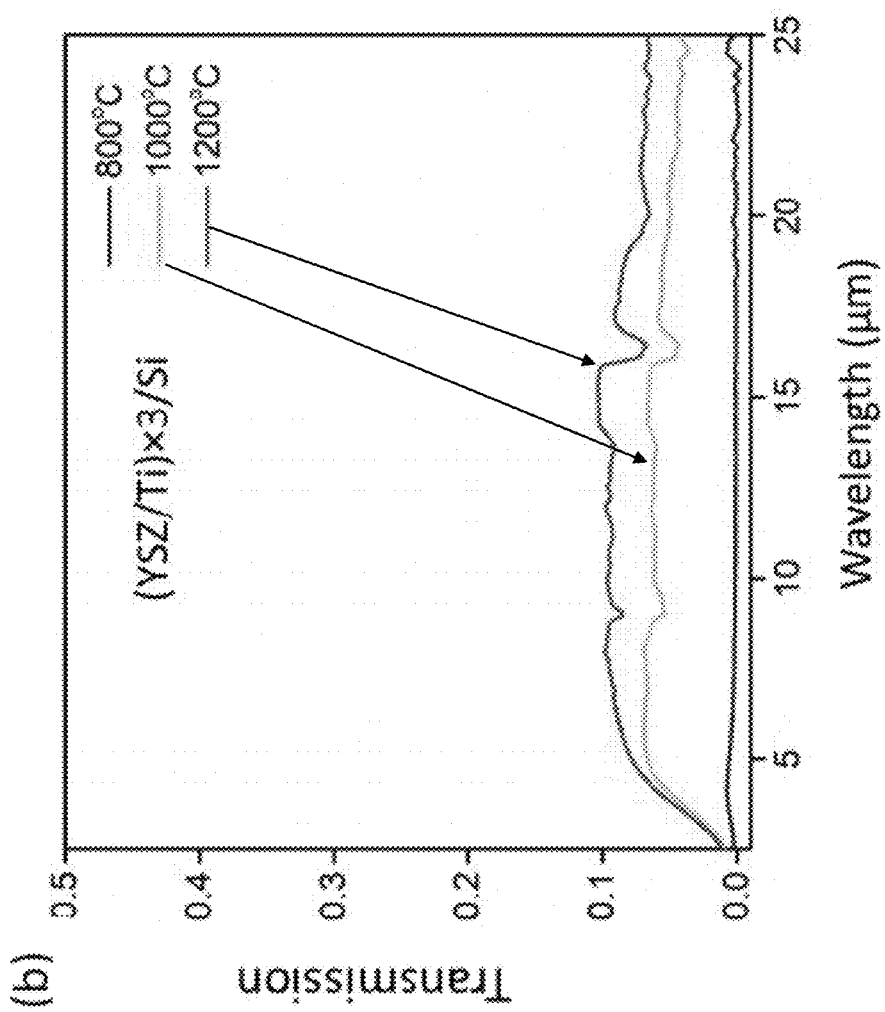

Based on the observations outlined herein, the YSZ/Ti metamaterials show low transmission (<10%) and good stability until at least T=1500° C. which is further shown in FIGS. 20a and 20b which are an SEM image (FIG. 20a) and a graph of transmission vs. wavelength showing transmission properties of the YSZ/Ti Metamaterials at T=1200° C. (FIG. 20b).

It should be noted that thermal conductivity refers to an intrinsic property of a material to transfer or conduct heat. It can be defined as the rate at which heat is transferred by conduction through a unit cross-section area of a material, when a temperature gradient exists perpendicular to the area. At high temperatures, the heat transport is dominated by harmonic and anharmonic phonon transport in insulating dielectrics. The present disclosure presents a composite structure that uses disordered porous YSZ as the host matrix of the presented thermal metamaterial which has an ultra-low thermal conductivity of about 0.06 W/m-K. Towards this end, the presented design requires high barrier to thermal conduction, i.e., low thermal conductivity. Porosity (microporous or nanoporous structures) is a crucial aspect in the design to obtaining low thermal conductivity.

It should be further noted that the most commonly used material in TBC applications is the conventional 7-8 YSZ which has a thermal conductivity of about 2.36 W/m-K. The design presented herein, however, has a much lower thermal conductivity. While YSZ has been discussed herein, it should be appreciated that other materials which have lower or comparable thermal conductivities when compared with conventional YSZ are within the ambit of the present disclosure some of which are listed in the Table II below.

TABLE II

Example material selection for the composite of the present disclosure

| Material | Thermal Conductivity (W/m-K) |
|---|---|
| 7-8 YSZ | 2.36 |
| $ZrO_2$ | 2.17 |
| $LaPO_4$ | 1.8 |
| $LaMgAl_{11}O_{19}$ | 1.7 |
| $La_2Zr_2O_7$ | 1.6 |
| $Sm_2Zr_2O_7$ | 1.5 |
| $Gd_2Zr_2O_7$ | 1.5 |
| $HfO_2$ | 1.1 |

It should further be noted that reflectivity is a measure of how much thermal radiation is reflected from a given material. The TBC material for the TDBC of the present disclosure should have a reflectivity above about 0.9 over an ultrabroadband thermal infrared region of about between 0.7 µm and about 15 µm. In the TDBC composite structure shown herein, an important feature is the simultaneously obtainment of low conductivity as discussed above and ultrahigh reflectivity. Specifically, the ultrahigh reflectivity is obtained by the novel use of thin metallic layers which reflect the light.

Furthermore, emissivity is a measure of how much thermal radiation a body emits to its environment. It is the ratio of the radiation emitted from its surface to the theoretical emissions of an ideal black body of the same size and shape. This parameter thus defines radiative heat transfer away from a given object. The TDBC composite structure of the present disclosure has an emissivity of at least below about 0.1.

Additionally, transmissivity is a measure of how much of the thermal radiation passes through the material. The TDBC composite structure of the present disclosure has a transmissivity of at least below about 0.1.

Finally material stability is of particular interest in the TDBC design of the present disclosure. The TDBC composite structure of the present disclosure is stable at very high temperature of great than about 1500° C., necessitating high temperature materials with very high melting points. While YSZ is discussed herein, it should be appreciated that other high temperature materials are also within the ambit of the present disclosure, as presented in Table III, below.

TABLE III

List of high temperature material used in the TDBC composite structure

| Material | Melting Point (° C.) |
|---|---|
| 7-8 YSZ | 2700 |
| $B_4C$ | 2350 |
| SiC | 2730 |
| $ZrB_2$ | 3000 |
| $HfB_2$ | 3250 |

Those having ordinary skill in the art will recognize that numerous modifications can be made to the specific implementations described above. The implementations should not be limited to the particular limitations described. Other implementations may be possible.

The invention claimed is:

1. A thermal dual-barrier coating (TDBC) system providing resistance for both conduction and radiation thermal transfer modes, comprising:
a first thermal barrier layer having a first thermal conductivity;
one or more composite structures vertically disposed adjacent the first thermal barrier layer, each of the one or more composite structures, comprising
an ultra-thin disordered semi-continuous metallic film and a layer of a second thermal barrier layer.

2. The TDBC system of claim 1, further comprising:
a third thermal barrier layer vertically disposed adjacent the one or more composite structures and configured to be coupled to a bond coat disposed atop a structure to be protected by the TDBC system.

3. The TDBC system of claim 1, wherein the first thermal barrier layer is made of a microporous or nanoporous material selected from the group consisting of YSZ, $ZrO_2$, $LaPO_4$, $LaMgAl_{11}O_{19}$, $La_2Zr_2O_7$, $Sm_2Zr_2O_7$, $Gd_2Zr_2O_7$, $HfO_2$, $B_4C$, SiC, $ZrB_2$, $HfB_2$, and combinations thereof.

4. The TDBC system of claim 1, wherein the second thermal barrier layer is made of a microporous or nanoporous material selected from the group consisting of YSZ, $ZrO_2$, $LaPO_4$, $LaMgAl_{11}O_{19}$, $La_2Zr_2O_7$, $Sm_2Zr_2O_7$, $Gd_2Zr_2O_7$, $HfO_2$, $B_4C$, SiC, $ZrB_2$, $HfB_2$, and combinations thereof.

5. The TDBC system of claim 2, wherein the third thermal barrier layer is made of a microporous or nanoporous material selected from the group consisting of YSZ, $ZrO_2$, $LaPO_4$, $LaMgAl_{11}O_{19}$, $La_2Zr_2O_7$, $Sm_2Zr_2O_7$, $Gd_2Zr_2O_7$, $HfO_2$, $B_4C$, SiC, $ZrB_2$, $HfB_2$, and combinations thereof.

6. The TDBC system of claim 1, wherein the thickness of the first thermal barrier layer is between about 20 μm to 200 μm.

7. The TDBC system of claim 1, wherein the material of the ultra-thin disordered semi-continuous metallic-alloy film is made from a material selected from the group consisting of Ag, Al, W, and combinations thereof.

8. The TDBC system of claim 1, wherein the ultra-thin disordered semi-continuous metallic film is made from Ti.

9. The TDBC system of claim 1, wherein the first thermal barrier layer is configured to be exposed to hot gases.

10. The TDBC system of claim 1, the one or more composite structures includes three composite structures.

11. The TDBC system of claim 1, wherein each ultra-thin disordered semi-continuous metallic film is between about 20 nm and 80 nm.

12. The TDBC system of claim 1, wherein each of the second thermal barrier layers is between about 100 nm to about 300 nm.

13. The TDBC system of claim 1, provides optical properties and thermal properties comprising:
thermal conductivity of about 0.06 W/m-K or less;
a reflectivity above about 0.9 over an ultrabroadband thermal infrared region of about 0.7 μm to about 15 μm;
emissivity of below about 0.1; and
transmissivity of below about 0.1.

14. The TDBC system of claim 8, provides optical and material stability up to about 1500° C.

15. A method of generating a thermal dual-barrier coating (TDBC) system providing resistance for both conduction and radiation thermal transfer modes, comprising:
depositing a first thermal barrier layer having a first thermal conductivity;
co-depositing one or more composite thermal metamaterial structures vertically adjacent the first thermal barrier layer, deposition of each of the one or more composite structures, comprising:
co-sputtering an ultra-thin disordered semi-continuous metallic film and a thin layer of a second thermal barrier layer.

16. The method of claim 15, further comprising:
depositing a third thermal barrier layer vertically adjacent the one or more composite structures.

17. The method of claim 15, wherein the ultra-thin disordered semi-continuous metallic film is made from a material selected from the group consisting of Ag, Al, W, and combinations thereof.

18. The method of claim 15, wherein the ultra-thin disordered semi-continuous metallic film is made from Ti.

19. The method of claim 16, wherein the deposition process of the first thermal barrier layer and the third thermal barrier layer includes an electron-beam physical vapor deposition (EB-PVD) process.

20. The method of claim 16, wherein the first thermal barrier layer and the third thermal barrier layer are deposited to a depth of between about 20 μm to about 200 μm.

21. The method of claim 15, wherein the ultra-thin disordered semi-continuous metallic film is co-sputtered to a thickness of between about 20 nm and 80 nm.

22. The method of claim 15, wherein the second thermal barrier layer is deposited to a thickness of between about 100 nm to about 300 nm.

23. The method of claim 15, wherein the first thermal barrier layer is made of a microporous or nanoporous material selected from the group consisting of YSZ, $ZrO_2$, $LaPO_4$, $LaMgAl_{11}O_{19}$, $La_2Zr_2O_7$, $Sm_2Zr_2O_7$, $Gd_2Zr_2O_7$, $HfO_2$, $B_4C$, SiC, $ZrB_2$, $HfB_2$, and combinations thereof.

24. The method of claim 15, wherein the second thermal barrier layer is made of a microporous or nanoporous material selected from the group consisting of YSZ, $ZrO_2$, $LaPO_4$, $LaMgAl_{11}O_{19}$, $La_2Zr_2O_7$, $Sm_2Zr_2O_7$, $Gd_2Zr_2O_7$, $HfO_2$, $B_4C$, SiC, $ZrB_2$, $HfB_2$, and combinations thereof.

25. The method of claim 16, wherein the third thermal barrier layer is made of a microporous or nanoporous material selected from the group consisting of YSZ, $ZrO_2$, $LaPO_4$, $LaMgAl_{11}O_{19}$, $La_2Zr_2O_7$, $Sm_2Zr_2O_7$, $Gd_2Zr_2O_7$, $HfO_2$, $B_4C$, SiC, $ZrB_2$, $HfB_2$, and combinations thereof.

26. The method of claim 15, wherein the TDBC provides optical properties and thermal properties comprising:
thermal conductivity of about 0.06 W/m-K or less;
a reflectivity above about 0.9 over an ultrabroadband thermal infrared region of about 0.7 μm to about 15 μm;
emissivity of below about 0.1; and
transmissivity of below about 0.1.

* * * * *